US011424120B2

(12) United States Patent
Luan et al.

(10) Patent No.: US 11,424,120 B2
(45) Date of Patent: Aug. 23, 2022

(54) PLASMA ETCHING TECHNIQUES

(71) Applicant: Tokyo Electron Limited, Tokyo (JP)

(72) Inventors: Pingshan Luan, Albany, NY (US);
Christopher Catano, Albany, NY (US);
Aelan Mosden, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/155,772

(22) Filed: Jan. 22, 2021

(65) Prior Publication Data
US 2022/0238309 A1    Jul. 28, 2022

(51) Int. Cl.
| H01L 21/02 | (2006.01) |
| H01J 37/32 | (2006.01) |
| H01L 21/311 | (2006.01) |
| H01L 21/3065 | (2006.01) |
| H01L 21/3213 | (2006.01) |

(52) U.S. Cl.
CPC .. *H01L 21/02381* (2013.01); *H01J 37/32449* (2013.01); *H01L 21/0234* (2013.01); *H01L 21/02532* (2013.01); *H01L 21/3065* (2013.01); *H01L 21/30655* (2013.01); *H01L 21/31116* (2013.01); *H01L 21/31144* (2013.01); *H01L 21/32135* (2013.01); *H01L 21/32136* (2013.01); *H01L 21/32137* (2013.01); *H01J 2237/3341* (2013.01)

(58) Field of Classification Search
None
See application file for complete search history.

(56) References Cited

U.S. PATENT DOCUMENTS

| 10,163,653 B2 | 12/2018 | Kitagaito et al. |
| 2013/0109188 A1* | 5/2013 | Kim ................ H01L 21/32139 438/710 |
| 2015/0126039 A1 | 5/2015 | Korolik et al. |
| 2015/0200109 A1 | 7/2015 | Kong et al. |
| 2017/0271165 A1* | 9/2017 | Kal ................... H01J 37/32724 |

(Continued)

OTHER PUBLICATIONS

Kim, Jong Kyu, et al. "Study on the Etching Characteristics of Amorphous Carbon Layer in Oxygen Plasma with Carbonyl Sulfide." Journal of Vacuum Science and Technology, vol. 31, No. 2, Jan. 28, 2013, doi:10.1116/1.4780122.

(Continued)

*Primary Examiner* — Jiong-Ping Lu
(74) *Attorney, Agent, or Firm* — Slater Matsil, LLP

(57) ABSTRACT

In certain embodiments, a method of processing a semiconductor substrate includes positioning a semiconductor substrate in a plasma chamber of a plasma tool. The semiconductor substrate includes a film stack that includes silicon layers and germanium-containing layers in an alternating stacked arrangement, with at least two silicon layers and at least two germanium-containing layers. The method includes exposing, in a first plasma step executed in the plasma chamber, the film stack to a first plasma. The first plasma is generated from first gases that include nitrogen gas, hydrogen gas, and fluorine gas. The method includes exposing, in a second plasma step executed in the plasma chamber, the film stack to a second plasma. The second plasma is generated from second gases comprising fluorine gas and oxygen gas. The second plasma selectively etches the silicon layers.

20 Claims, 11 Drawing Sheets

(56) References Cited

U.S. PATENT DOCUMENTS

| | | |
|---|---|---|
| 2017/0330958 A1 | 11/2017 | Coquand et al. |
| 2017/0342553 A1 | 11/2017 | Yu et al. |
| 2018/0315665 A1 | 11/2018 | Mosden et al. |
| 2019/0051744 A1 | 2/2019 | Coquand et al. |
| 2019/0172751 A1 | 6/2019 | Smith et al. |
| 2019/0276739 A1 | 9/2019 | Liu et al. |
| 2019/0355617 A1 | 11/2019 | O'Meara et al. |
| 2019/0355851 A1 | 11/2019 | Seshadri et al. |
| 2019/0393350 A1 | 12/2019 | Thompson et al. |
| 2020/0027741 A1 | 1/2020 | Kal et al. |
| 2020/0052131 A1 | 2/2020 | Chen et al. |
| 2020/0075718 A1 | 3/2020 | Wang et al. |
| 2020/0105869 A1 | 4/2020 | Loubet et al. |
| 2020/0266070 A1* | 8/2020 | Voronin ............ H01L 21/02532 |

OTHER PUBLICATIONS

Ahles et al., "Selective Etching of Silicon in Preference to Germanium and Si0.5Ge0.5", Materials Science and Engineering Program and Department of Chemistry and Biochemistry, ACS Applied Materials & Interfaces 2017, pp. 20947-20954, 8 pages total.

\* cited by examiner

PLASMA ETCHING TECHNIQUES

TECHNICAL FIELD

This disclosure relates generally to semiconductor fabrication, and, in certain embodiments, to plasma etching techniques.

BACKGROUND

The integrated circuit (IC) manufacturing industry strives to increase device density to improve speed, performance, and costs. For continued scaling to smaller node sizes, device architectures have evolved from two-dimensional (2D) planar structures to three-dimensional (3D) vertical structures, such as with nanowires or vertically oriented transistors. Insufficient control of the conducting channel by the gate potential drives a desire for this change. Short channel effects (SCE) may become too significant as gate dimensions are scaled down and may increase current conduction when no voltage is applied to the gate ($I_{off}$). A change in device architecture may allow better electrostatic control of the gate to reduce the SCE and power loss. Fabricating nanowire devices may present 3D etch challenges where highly selective isotropic etch processes are beneficial. For example, layers of exposed materials may need to be etched relative to one another to create indents in a film stack.

SUMMARY

In certain embodiments, a method of processing a semiconductor substrate includes receiving a semiconductor substrate that includes a film stack. The film stack includes a first germanium (Ge)-containing layer, a second Ge-containing layer, and a first silicon (Si) layer positioned between the first Ge-containing layer and the second Ge-containing layer. The method includes modifying, in a first plasma step, exposed surfaces of the first Ge-containing layer, the second Ge-containing layer, and the first Si layer by exposing the exposed surfaces to a first plasma. Modifying the exposed surfaces includes removing at least a portion of a native oxide layer (NOL) from the exposed surfaces of the first Si layer and forming a passivation layer on the exposed surfaces of the first Ge-containing layer and the second Ge-containing layer. The method includes, in a second plasma step, etching, using a second plasma, the first Si layer to form an indent in the film stack at the first Si layer between the first Ge-containing layer and the second Ge-containing layer. The passivation layer inhibits etching of the first Ge-containing layer and the second Ge-containing layer.

In certain embodiments, a method of processing a semiconductor substrate includes positioning a semiconductor substrate in a plasma chamber of a plasma tool. The semiconductor substrate includes a film stack that includes Si layers and Ge-containing layers in an alternating stacked arrangement, with at least two Si layers and at least two Ge-containing layers. The method includes exposing, in a first plasma step executed in the plasma chamber, the film stack to a first plasma. The first plasma is generated from first gases that include nitrogen gas, hydrogen gas, and fluorine gas. The method includes exposing, in a second plasma step executed in the plasma chamber, the film stack to a second plasma. The second plasma is generated from second gases comprising fluorine gas and oxygen gas. The second plasma selectively etches the Si layers.

In certain embodiments, a method of processing a semiconductor substrate includes positioning a semiconductor substrate in a plasma chamber of a plasma tool. The semiconductor substrate includes a film stack that includes Si layers and Ge-containing layers in an alternating stacked arrangement, with at least two Si layers and at least two Ge-containing layers. The method includes generating a plasma in the plasma chamber. Generating the plasma includes injecting, into the plasma chamber, gases that include an etchant-containing gas, a passivation-triggering gas, and a carrier gas. The plasma includes etchant agents and passivation agents. The method includes exposing the film stack to the plasma in the plasma chamber. The method includes terminating, after a time period, injecting the etchant-containing gas into the plasma chamber and continuing injecting the passivation-triggering gas into the plasma chamber.

BRIEF DESCRIPTION OF THE DRAWINGS

For a more complete understanding of this disclosure, and advantages thereof, reference is made to the following descriptions taken in conjunction with the accompanying drawings, in which.

DETAILED DESCRIPTION OF ILLUSTRATIVE EMBODIMENTS

Figure 1A:
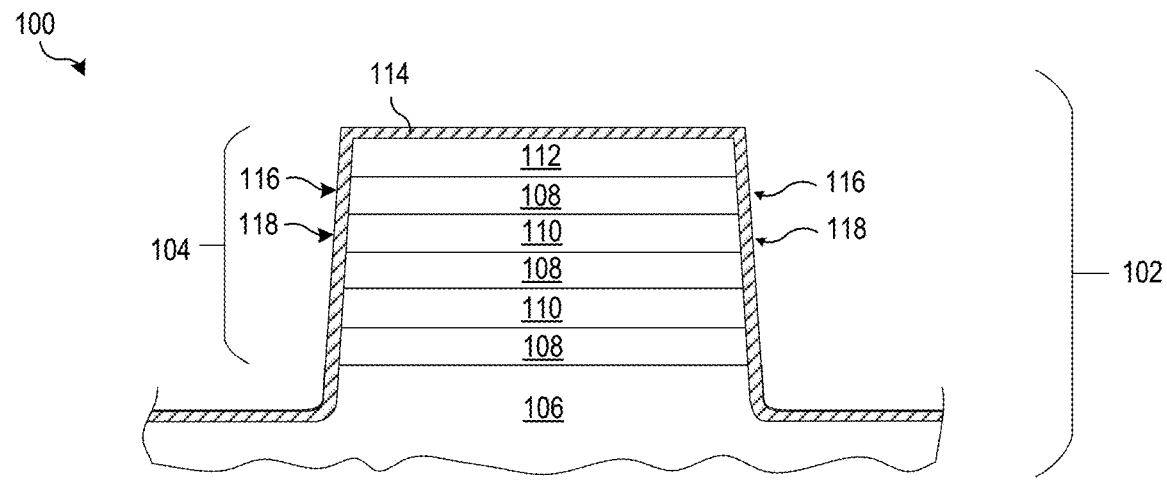
FIGS. 1A-1F illustrate cross-sectional views of an example semiconductor substrate during an example process for processing the semiconductor substrate.

Various techniques for attempting to selectively etch one material relative to another exist. In some cases the chemistry of two materials is sufficiently distinct to allow a plasma that is selective to etching one of the materials to be used without concern for etching the other material. In other cases determining appropriate etching regimes for selective etching is more difficult because the chemistry of the materials may be similar or the available etching processes may be limited by other factors. Certain materials present more difficult selectivity challenges where it is desirable to etch one material with little to no etching of another material. Conventional processes for this type of selective etching may be unable to achieve selective etching of one material relative to another or may fall short of process requirements such as selectivity, etch profile (e.g., local uniformity and/or surface roughness), and others.

Selectivity challenges may arise in forming nanowires or nanosheets to act as a channel region in a 3D vertical structure of a semiconductor device, such as a gate-all-around (GAA) device. Forming such nanowires may involve forming a film stack on a base layer, the film stack including layers of Si and Ge or Si—Ge (SiGe) arranged in an alternating stack. Part of this process may include etching indents, or recesses, in the film stack at opposing ends of the Si layers, while minimizing etching of the Ge-containing layers, to expose end portions of the Ge-containing layers for later use as a conducting device. Due to various challenges, including in part a NOL and/or other residues (e.g. reactive ion etching residue) present on surfaces of the film stack, conventional etching techniques may be unsatisfactory.

For example, some conventional techniques employ a single etch step using a plasma generated from nitrogen trifluoride ($NF_3$) (or another etchant) and oxygen ($O_2$), without any prior step to remove the NOL. Fluorine radicals in this plasma may etch the Si layers, while oxygen may react with the Ge in the Ge-containing layers to form a Ge oxide (e.g., $GeO_2$) protection layer on the Ge-containing layers. Post-etch, however, resulting structures of such a single etch step without any prior step to remove or otherwise modify the NOL and/or without any continuing formation of a passivation layer at an end portion of the etch step generally show unacceptable levels of surface roughness along exposed surfaces of the Si layers and the Ge-containing layers, resulting in part from etching the NOL, and gouging into Ge-containing layers near the etch front of the Si layers due to the shorter lifetime of passivation agents (e.g., oxygen) as opposed to etchants (e.g., fluorine).

As another example, prior to performing the plasma etch to form indents in the film stack, some conventional techniques use a wet or dry process to remove the NOL. The film stack may be processed using a dilute hydrogen-fluoride (HF) acid or a chemical oxide removal process. Removing the NOL over surfaces of both the Si layers and Ge-containing layers, however, may reduce the selectivity of the subsequent indent plasma etch process (e.g., using $NF_3$ and $O_2$) to etch the Si layers relative to the Ge-containing layers. Also, these native oxide removal processes are performed in a tool separate from the tool used to perform the indent plasma etch, adding time and cost to the integrated fabrication process.

As another example, in the etch step using a plasma generated from $NF_3$ (or another etchant) and oxygen ($O_2$), when the time to terminate the plasma etch process occurs, conventional techniques terminate the flow of both the etchant-containing gas (e.g., $NF_3$) and the passivation-triggering gas (e.g., $O_2$) (that is, the gas that results in the presence of passivation reactants in the generated plasma that cause a passivation layer to be formed on exposed surfaces of the Ge-containing layers) at substantially the same time. However, the etchants (e.g., fluorine atoms) in the plasma have longer lifetimes than the passivation reactants (e.g., oxygen atoms) in the plasma, such that the passivation reactants dissipate more quickly than the etchants. In one example (though particular values may depend on a variety of factors), oxygen passivation reactants expire in a few tenths of a second, while fluorine etchants expire in about 2 to about 5 seconds or possibly more. This property means the film stack will continue to be exposed to the etchants for a time period, with little to no passivation reactants present to form a passivation, or protection, layer on exposed surfaces of the Ge-containing layers, undesirably allowing the etchants to etch portions of the Ge-containing layers. An immediate purge of the plasma chamber of a plasma tool is insufficient to address this problem, at least because the relatively lengthy mechanical purge process does not remove the etchants fast enough to account for the different lifetimes of the passivation reactants and the etchants.

The longer etchant lifetime may result in reduced or completely lost selectivity of the plasma to etch the Si layers rather than the Ge-containing layers. As a result, so-called "gouging" of the Ge-containing layers may occur at the etch front in areas near the interface of the Ge-containing layers and their adjacent Si layers in the alternating film stack, as well as excessive etching of the Si layers. The gouging may be particularly present at the etch front (areas of Ge-containing layers most recently exposed to the etchant), as those areas of the Ge-containing layers have experienced reduced or no exposure to the passivation reactants. Furthermore, this gouging of the Ge-containing layers at the etch front may cause the Ge-containing layers to have poor local uniformity, with an undesirable thickness loss, including at areas near the interface of the Ge-containing layers and their adjacent Si layers in the film stack.

Embodiments described below provide various methods of selective etching. For example, embodiments may be used to selectively etch portions of a film stack (e.g., that includes Si layers and Ge-containing layers in an alternating stacked arrangement) of a substrate. It may be desirable to selectively etch indents, or recesses, in edge portions of (or possibly completely remove) the Si layers to form nanowires of the Ge-containing layers.

Certain embodiments use a two-step plasma process to form indents in a film stack that includes Si layers and Ge-containing layers in an alternating stacked arrangement. In a pre-etch first step (e.g., a surface modification step), a substrate that includes the film stack is exposed to a first plasma that may substantially remove or otherwise chemically alter a barrier layer (e.g., an NOL) over exposed surfaces of the Si layers and cause a passivation layer (e.g., a Ge-nitride or Ge oxynitride passivation layer) to be formed on exposed surfaces of the Ge-containing layers. In a second step, the substrate, as modified in the surface modification step, is exposed to a second plasma to selectively etch edge portions of the Si layers, the passivation layer inhibiting etching of the Ge-containing layers during exposure to the second plasma. The two-step plasma process may be performed in situ in a plasma chamber of a plasma tool.

Certain embodiments terminate injection (flow) of the etchant-containing gas (e.g., $NF_3$) into the plasma chamber prior to terminating injection (flow) of the passivation-triggering gas (e.g., $O_2$), allowing passivation reactants (e.g., oxygen atoms) in the generated plasma to continue to form a passivation layer on exposed surfaces of the Ge-containing layers while the etchants (e.g., fluorine atoms) in the generated plasma expire.

FIGS. 1A-1F illustrate cross-sectional views of an example substrate 102 during an example process 100 for processing substrate 102, according to certain embodiments. Process 100 may include a pre-etch first plasma process to modify certain surfaces of substrate 102 and a second plasma process to etch portions of certain layers of a film stack of substrate 102, resulting in substrate 102 having an indented film stack following execution of process 100.

As shown in FIG. 1A, substrate 102 is a semiconductor substrate that includes film stack 104 disposed on a base layer 106. Film stack 104 includes Si layers 108 and Ge-containing layers 110 in an alternating stacked arrangement. Film stack 104 may have any suitable shape and include any suitable number of layers. As examples, the vertical thickness of Si layers 108 and Ge-containing layers 110 may be about 10 nm to about 25 nm each, and as particular examples may be about 10 nm or about 20 nm. Si layers 108 may have the same thicknesses or vary in thickness relative to one another, Ge-containing layers 110 may have the same thickness or vary in thickness relative to one another, and Si layers 108 and Ge-containing layers 110 may have the same thicknesses or vary in thickness relative to one another. In an example, Si layers 108 and Ge-containing layers 110 all have substantially the same thicknesses.

The material of Si layers 108 may be pure Si or Si nitride (SiN), for example. In certain embodiments, all Si layers 108 include the same material; however, Si layers 108 may include different materials if desired.

The material of Ge-containing layers no may be pure Ge or SiGe alloy, for example. As a particular example, the Ge-containing layers no may include a SiGe alloy (mixture) in an appropriate ratio (e.g., $Si_{0.7}Ge_{0.3}$, $Si_{0.75}Ge_{0.25}$, etc.) for desired etching properties of a given application or for desired performance in a resulting semiconductor device formed using, in part, process 100. In certain embodiments, all Ge-containing layers 110 include the same materials; however, Ge-containing layers 110 may include different materials if desired.

Base layer 106 may be any suitable material and includes Ge or SiGe alloy in one example. In a particular example, film stack 104 is formed by growing alternating heteroepitaxial layers of Si (e.g., Si layers 108) and Ge or SiGe (e.g., Ge-containing layers 110) atop base layer 106.

An optional hard mask 112 may be included on top of film stack 104. Hard mask 112 may have been used to form the structure of film stack 104, in a previous etch process for example. In certain embodiments, hard mask 112 is SiN but may include any suitable material.

A barrier layer 114 is formed over film stack 104 (including hard mask 112) and, in this example, base layer 106. Barrier layer 114 may result from prior fabrication steps (e.g. reactive ion etching) applied to substrate 102 or to other handling of substrate 102. As particular examples, barrier layer 114 may include an NOL, reactive ion etching residue, or both. An NOL may be a thin layer of $SiO_2$ (or other suitable material), about 1 nm to about 2.0 nm thick for example, that forms on surfaces of substrate 102, such as when substrate 102 is exposed to ambient air, which contains $O_2$ and $H_2O$, when transferring between processing tools. For example, surfaces of base layer 106, Si layers 108, Ge-containing layers 110, and hard mask 112 may interact with the ambient air, which may result in barrier layer 114 at those surfaces. As another example, surfaces of base layer 106, Si layers 108, Ge-containing layers 110, and hard mask 112 may include a residue resulting from prior reactive ion etching steps.

Barrier layer 114 may have different etch properties than layers that underlie barrier layer 114. Although shown as having generally uniform coverage over film stack 104 (including hard mask 112) and base layer 106, barrier layer 114 might or might not have uniform coverage.

Each of the layers in film stack 104 has a pair of exposed surfaces at opposed ends when viewed, as illustrated, from a cross-sectional perspective. That is, each of Si layers 108 has (opposing) exposed surfaces 116, and each of Ge-containing layers 110 has (opposing) exposed surfaces 118. Additionally, in the state illustrated in FIG. 1A, because substrate 102 includes barrier layer 114, exposed surfaces of 116 of Si layers 108 and exposed surfaces 118 of Ge-containing layers 110 include barrier layer 114.

Figure 1B:
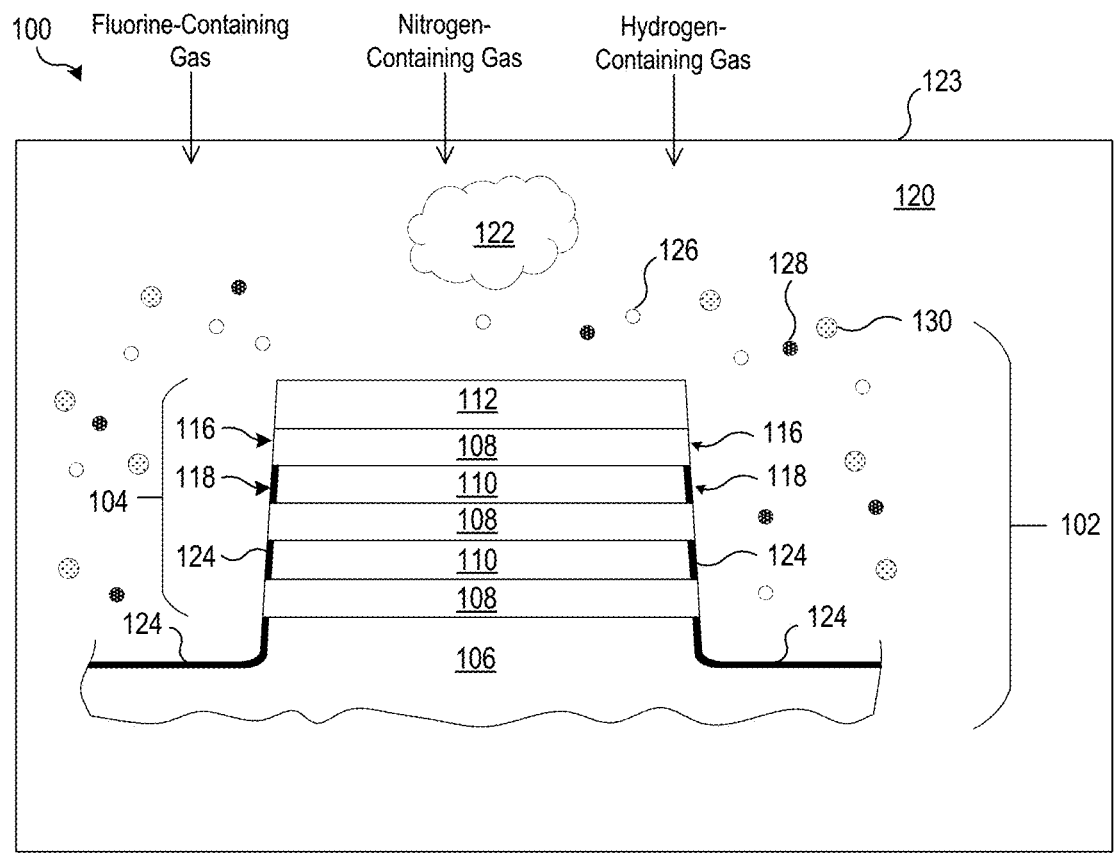

As illustrated in FIG. 1B, in a plasma step 120 of process 100, substrate 102 is exposed to plasma 122 to modify exposed surfaces 116 of Si layers 108 and exposed surfaces 118 of Ge-containing layers 110. Plasma step 120 also may be referred to as a surface modification step. Plasma step 120 may be performed in a plasma chamber 123 of a plasma tool. The plasma tool may be any suitable type of plasma tool, including a capacitively-coupled plasma (CCP) tool, an inductively-coupled plasma (ICP) tool, a surface wave plasma (SWP) tool, an electron cyclotron resonance (ECR) plasma tool, and others. An example plasma tool is described below with regard to FIG. 8.

In certain embodiments, modifying exposed surfaces 116 of Si layers 108 includes removing all or a portion of barrier layer 114 from exposed surfaces 116. For example, modifying exposed surfaces of 116 of Si layers 108 may include removing or reducing a thickness of barrier layer 114 from exposed surfaces 116. Additionally or alternatively, modifying exposed surfaces 116 of Si layers 108 may include chemically transforming barrier layer 114 at exposed surfaces 116 into a form that is more easily etched in a subsequent etch step (e.g., the etch step described below with reference to FIG. 1D).

In certain embodiments, modifying exposed surfaces 118 of Ge-containing layers 110 includes forming a passivation layer 124 on exposed surfaces 118. Plasma 122 may cause passivation layer 124 to form on exposed surfaces 118 of Ge-containing layers 110 by removing and replacing or otherwise modifying portions of barrier layer 114 on exposed surfaces 118. For example, forming passivation layer 124 may include removing barrier layer 114 from (or reducing the thickness of barrier layer 114 on) exposed surfaces 118 of Ge-containing layers 110 and modifying resulting exposed surfaces 118 to include passivation layer 124. Passivation layer 124 also may be formed on exposed surfaces of base layer 106, such as when base layer 106 is pure Ge or includes Ge (e.g., a SiGe base layer 106).

Although passivation layer 124 may have any suitable thickness, in certain embodiments, passivation layer is relatively thin, such as 2 nm or less. Passivation layer 124 could be, for example, a monolayer. In certain embodiments, passivation layer 124 includes nitrogen, such as Ge nitride (e.g., $Ge_3N_4$), or Ge oxynitride (GeON).

Thus, in contrast to certain conventional techniques that might strip barrier layer 114 using a dry or wet etch process both from exposed surfaces 116 of Si layers 108 and from exposed surfaces 118 of Ge-containing layers 110, leaving exposed surfaces 118 of Ge-containing layers 110 without a protective etch stop layer and thereby sacrificing selectivity to Ge-containing layers 110 in a subsequent etch step (e.g., the etch step described below with reference to FIG. 1D), plasma step 120, using plasma 122, modifies (and possibly remove) barrier layer 114 at exposed surfaces 116 of Si layers 108 while also forming passivation layer 124 at exposed surfaces 118 of Ge-containing layers 110. Furthermore, in contrast to conventional techniques that might strip barrier layer 114 using a dry or wet etch process, plasma step 120 may be performed in a same plasma tool that is used to perform a subsequent etch step (e.g., the etch step described below with reference to FIG. 1D).

Plasma 122 may include fluorine agents 126 (e.g., atomic fluorine), hydrogen agents 128 (e.g., atomic hydrogen), and nitrogen agents 130 (e.g., atomic nitrogen). Fluorine agents 126 may act as the etchant for removing or otherwise modifying some or all of barrier layer 114. Hydrogen agents 128 may act as a reducing agent, facilitating the breakdown of barrier layer 114 in the presence of fluorine agents 126. Furthermore, if applicable depending on the gases used to generate plasma 122, hydrogen agents 128 may further break down certain compounds of fluorine and nitrogen to produce fluorine agents 126 and nitrogen agents 130. Nitrogen agents 130 in plasma 122 react with the Ge at exposed surfaces 118 of Ge-containing layers 110 to form a nitride (e.g., a Ge nitride, $Ge_3N_4$, or Ge oxynitride, GeON) passivation layer 124 at exposed surfaces 118. For example, the atomic nitrogen (N) generated in plasma 122 may react with the Ge molecules at exposed surfaces 118 of Ge-containing layers 110 (and exposed surfaces of base layer 106) to form a passivation layer 124 (e.g., a nitride layer) on exposed surfaces 116 of Ge-containing layers 110 (and on exposed surfaces of base layer 106).

Plasma 122, containing fluorine agents 126, hydrogen agents 128, and nitrogen agents 130, when processed under appropriate conditions in plasma chamber 123, may generate chemically reactive neutrals such as N, H, NH, $NH_2$, F, $F_2$, HF, and/or $NH_3$, which interact with barrier layer 114 at exposed surfaces 116 of Si layers 108 and exposed surfaces 118 of Ge-containing layers 110. This interaction may reduce or remove barrier layer 114 at exposed surfaces 116 of Si layers 108 and exposed surfaces 118 of Ge-containing layers 110. For example, this interaction may chemically modify barrier layer 114 at exposed surfaces 116 of Si layers 108 to be more easily etched in a subsequent etch step. As another example, this interaction may modify barrier layer 114 at exposed surfaces 116 of Si layers 108 by thinning or completely removing barrier layer 114 at exposed surfaces 116. Furthermore, this interaction may reduce or remove barrier layer 114 at exposed surfaces 118 of Ge-containing layers 110 and form passivation layer 124 at exposed surfaces 118. Passivation layer 124 may include portions of barrier layer 114 that are not removed by plasma 122 at plasma step 120.

In certain embodiments, plasma 122 is generated from gases that include fluorine gas, nitrogen gas, and hydrogen gas. As examples, the fluorine gas used to generate plasma 122 may include $NF_3$, sulfur hexafluoride ($SF_6$), or carbon tetrafluoride ($CF_4$). Furthermore, although fluorine is described, other halogens may be used as etchants.

As a particular example, the gases used to generate plasma 122 may include a suitable combination of $NF_3$, $N_2$, and $H_2$. As another particular example, the gases may include $NF_3$, ammonia ($NH_3$), and $N_2$. In certain embodiments, the $N_2$ could be replaced by a noble gas, such as Argon (Ar) or Krypton (Kr), or such a noble gas may be used in combination with $N_2$. As particular examples, gases/gas combinations used to generate plasma 122 may include $N_2/H_2/NF_3$, $N_2/NH_3/NF_3$, $Ar/NH_3/NF_3$, $N_2/H_2/Ar/NF_3$, or $N_2/H_2/NH_3/NF_3$.

In an example in which gases used to generate plasma 122 include $NF_3$ and $H_2$, the ratio of $NF_3$ to $H_2$ may be an appropriate consideration. The suitable ratio (or range of ratios) may depend on a variety of factors, including other plasma process parameters and the concentration of Ge in Ge-containing layers 110. Example ranges for the ratio of $NF_3$ to $H_2$ may include from $NF_3:H_2=1:1.2$ to $NF_3:H_2=1:3$. Example ranges for the ratio of $NF_3$ to $N_2$ may include from $NF_3:N_2=1:2$ to $NF_3:H_2=1:8$.

Other plasma process parameters for generating plasma 122 include gas flow rates, pressure, plasma source power, plasma bias power, time, and temperature. The gases for forming plasma 122 may be provided at any suitable flow rate. In various embodiments, the gas flow rates are $NF_3=20$ standard cubic centimeters per minute (sccm)–50 sccm, $H_2=40$ sccm–100 sccm, $N_2=50$ sccm–300 sccm. In certain embodiments, plasma step 120 may be performed at moderate pressure (e.g., about 100 mTorr to about 500 mTorr, and in one example about 350 mTorr) and at moderate source power (e.g., about 50 W to about 500 W, and in one example about 200 W) without any bias power. Exposure time for plasma step 120 may be any suitable time. In certain embodiments, exposure time could be as little as about five seconds or less. In certain embodiments, exposure time is about fifteen seconds. In certain embodiments, plasma step 120 is performed at a temperature on substrate 102 of approximately −20° C. to approximately 40° C., and in one example at about ° C. It should be understood that particular values and ranges provided herein are for example purposes only.

An example parameter set for plasma step 120 includes: pressure 350 mtorr; source power (inductively-coupled plasma) 200 W; bias power 0 W; wafer processing temperature 0° C.; and $NF_3$, $H_2$, and $N_2$ flow rates of 40 sccm, 80 sccm, and 250 sccm, respectively.

Figure 1C:
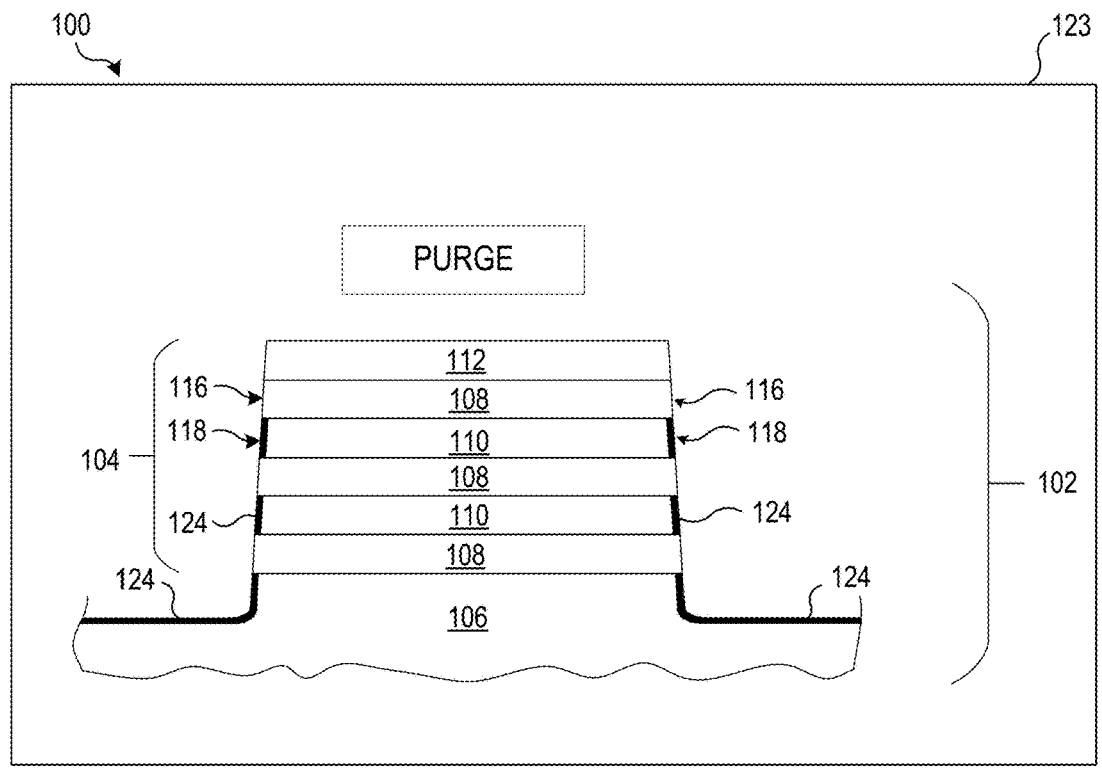

As shown in FIG. 1C, plasma chamber 123 may be purged, which may substantially remove previous gases and associated agents (e.g., fluorine agents 126, hydrogen agents 128, and nitrogen agents 130) from plasma chamber 123 to reduce or eliminate interference by those gases or agents with subsequent plasma steps in plasma chamber 123.

Figure 1D:
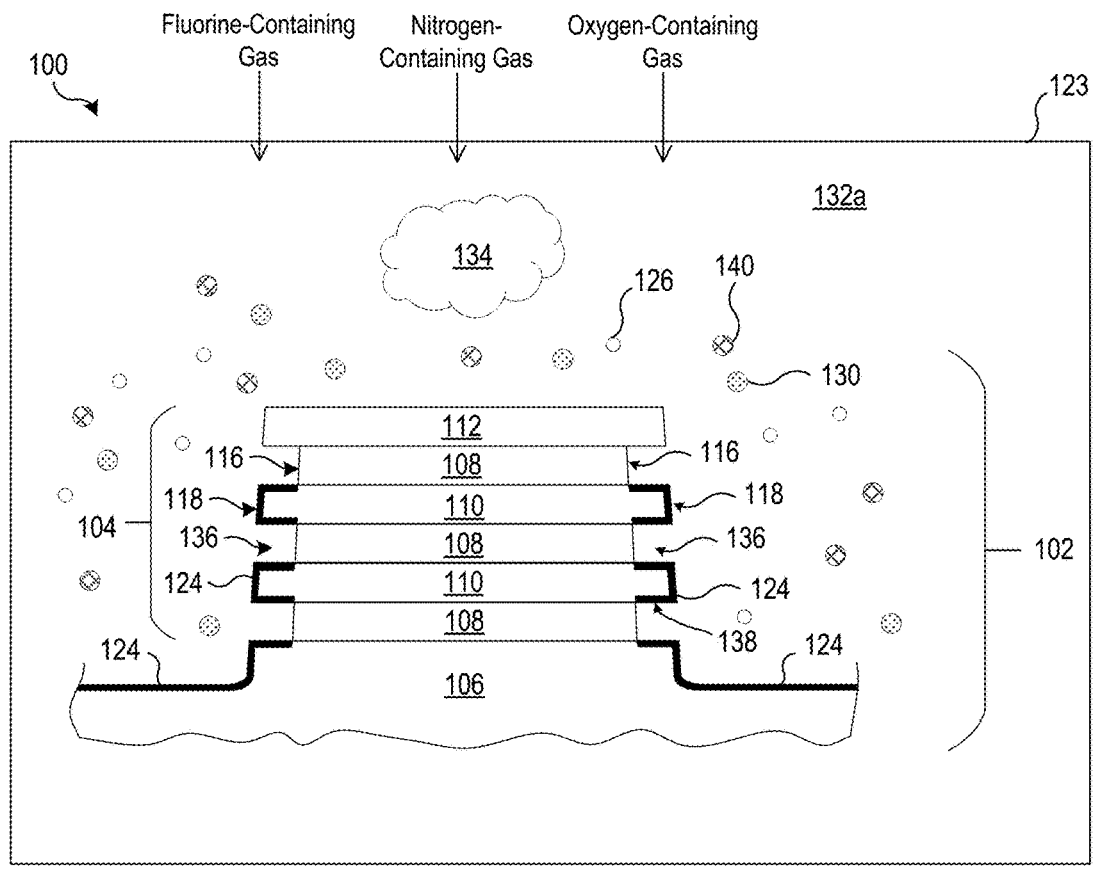
Figure 1E:
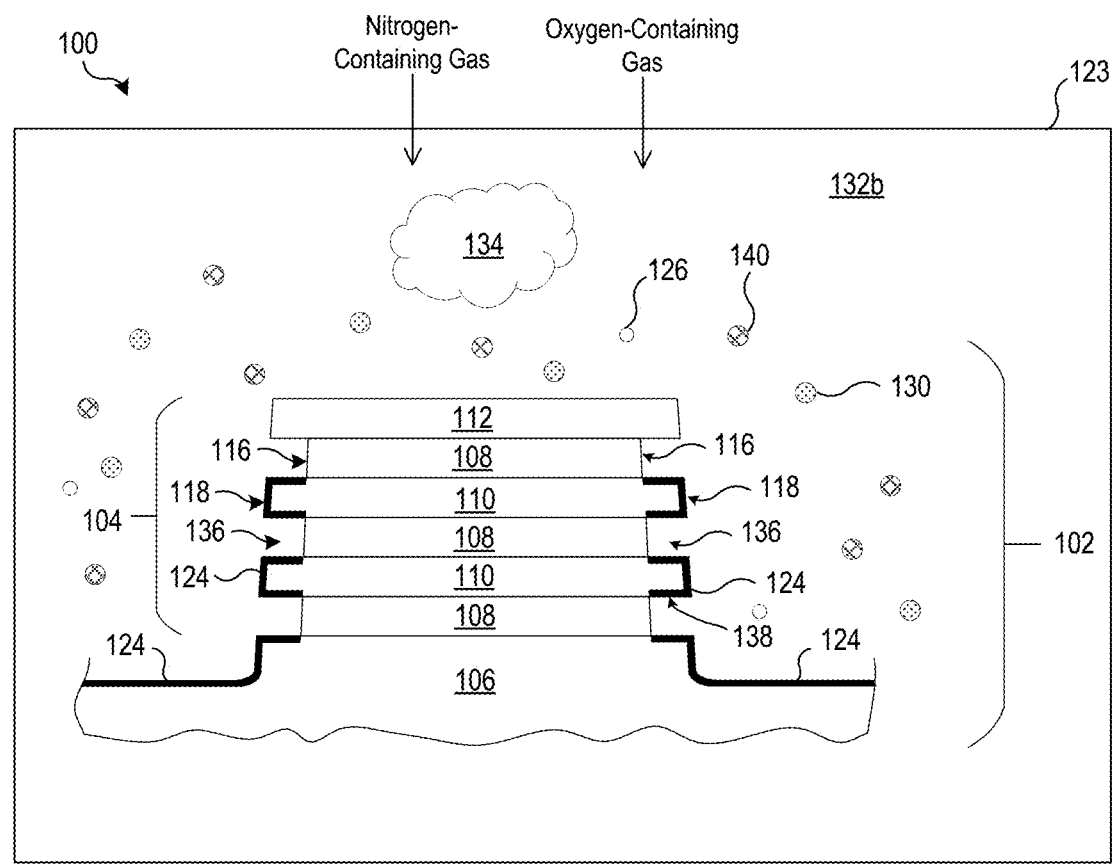

FIGS. 1D-1E illustrate plasma steps 132a and 132b of process 100, referred to collectively as plasma step 132. In certain embodiments, plasma step 132 is an isotropic etch process. As illustrated in FIG. 1D, in plasma step 132a, substrate 102 is exposed to plasma 134 to etch portions of film stack 104. For example, substrate 102 may be exposed to plasma 134 to form indents 136, or recesses, in film stack 104, with opposing end portions of Si layers 108 being removed relative to adjacent Ge-containing layers 110. During exposure of substrate 102 to plasma 134, passivation layer 124 on exposed surfaces 118 of Ge-containing layers 110 (and, in this example, on base layer 106) inhibits etching of Ge-containing layers 110 (and of base layer 106). In other words, plasma 134 selectively etches Si layers 108 due at least in part to the presence of passivation layer 124 on exposed surfaces 118 of Ge-containing layers 110 (and on exposed surfaces of base layer 106).

Plasma 134 includes etching agents and passivation agents. In certain embodiments, the etching agents of plasma include fluorine agents 126 and the passivation agents include oxygen agents 140. For example, fluorine agents 126 may include atomic fluorine and oxygen agents 140 may include atomic oxygen. Plasma 134 may be generated from gases that include an etchant-containing gas (e.g., a fluorine-containing gas), a passivation-triggering gas (e.g., an oxygen-containing gas), and, in certain embodiments, a carrier gas (e.g. $N_2$). For example, plasma 134 may be generated from gases including $NF_X$, $O_Y$, and $N_2$, and in a particular example may be generated from gases including $NF_3$, $O_2$ (or carbon dioxide ($CO_2$)), and $N_2$. In general, fluorine agents 126 act as the etchant for etching Si layers 108. Although fluorine is described, other etchants may be used, if appropriate. As particular examples, gases/gas combinations used to generate plasma 134 may include, with $N_2$ acting as an inert carrier gas: $NF_3/O_2/N_2$, $SF_6/O_2/N_2$, $CF_4/O_2/N_2$, $NF_3/SF_6/O_2/N_2$, $NF_3/CF_4/O_2/N_2$, or $SF_6/CF_4/O_2/N_2$.

As plasma 134 selectively etches Si layers 108, additional surfaces 138 of Ge-containing layers 110 are exposed, and plasma 134 may form passivation layer 124 on additional surfaces 138. For example, passivation layer 124 formed on additional surfaces 138 is an oxide passivation layer resulting from the oxygen (e.g., oxygen agents 140) in plasma 134. In other words, passivation layer 124 is further formed over newly exposed surfaces (e.g., additional surfaces 138)

of Ge-containing layers 110 as Si layers 108 are etched above, below, and/or between Ge-containing layers 110. Passivation layer 124 at additional surfaces 138 inhibits etching of Ge-containing layers 110 at additional surfaces 138, while passivation layer 124 at exposed surfaces 118 of Ge-containing layers 110 continues to inhibit etching of Ge-containing layers 110 at exposed surfaces 118. In certain embodiments, portions of passivation layer 124 include a Ge nitride or oxynitride passivation layer (e.g., at exposed surfaces 118) and portions of passivation layer 124 include an oxide passivation layer (e.g., at additional surfaces 138).

Other process parameters for generating plasma 134 include gas flow rates, pressure, plasma source power, plasma bias power, time, and temperature. The gases for forming plasma 134 may be provided at any suitable flow rate. In certain embodiments, the etchant source gas flow rate is $NF_3$=50 sccm–300 sccm and $O_2$=75 sccm–450 sccm, and the $NF_3$:$O_2$ ratio is an appropriate consideration and is in the range of 1:1.27 to 1:3 sccm. In certain embodiments, plasma step 132a may be performed at intermediate pressure of about 100 mTorr to about 500 mTorr, and in one example about 350 mTorr, and at intermediate source power of about 100 W to about 400 W, and in one example about 200 W). Exposure time for plasma step 132a may be any suitable time. In certain embodiments, exposure time could be as little as about five seconds or less. In certain embodiments, exposure time is about fifteen seconds. In certain embodiments, plasma step 132a is performed at a temperature on substrate 102 of approximately −20° C. to approximately 40° C., and in one example at about ° C. It should be understood that particular values and ranges provided herein are for example purposes only.

An example parameter set for plasma step 132a includes: pressure 350 mtorr; source power (inductively coupled plasma) 200 W; bias power 0 W; wafer processing temperature 0° C.; and $NF_3$, $O_2$, and $N_2$ flow rates of 200 sccm, 300 secm, and 500 secm, respectively.

As illustrated in FIG. 1E, in plasma step 132b, injection (flow) of the etchant-containing gas (e.g., a fluorine-containing gas) into plasma chamber 123 is terminated, while the injection (flow) of a passivation-triggering gas (e.g., an $O_2$-containing gas) into plasma chamber 123 continues, resulting in generation of plasma 134'. As described above, etchants (e.g., fluorine agents 126) in plasma 134' have a longer lifetime than passivation reactants (e.g., oxygen agents 140). Terminating injection/flow of the etchant-containing gas (e.g., a fluorine-containing gas) into plasma chamber 123 while continuing to inject/flow the passivation-triggering gas (e.g., oxygen-containing gas) into plasma chamber 123, allows passivation layer 124 to continue to be formed on exposed surfaces 118 and additional surfaces 138 of Ge-containing layers 110 as the etchants (e.g., fluorine agents 126) in plasma 134' expire, even as additional surfaces 138 continue to be exposed due to the presence of the expiring etchants. That is, during exposure of substrate 102 to plasma 134', passivation layer 124 on exposed surfaces 118 and additional surfaces 138 of Ge-containing layers 110 (and, in the illustrated example, on base layer 106) inhibits etching of Ge-containing layers 110 (and, in the illustrated example, of base layer 106) as the etchants (e.g., fluorine agents 126) in plasma 134' expire.

Plasma 134 in plasma step 132b is labeled as plasma 134' to represent that the content of plasma 134' is changing following the termination of injecting the etchant-containing gas (e.g., $NF_3$) and the ongoing expiration of etchants (e.g., fluorine atoms) in plasma 134' during plasma step 132b. In certain embodiments, the process conditions for generating plasma 134' are similar to those described above for generating plasma 134, except that the injection of the etchant-containing gas (e.g., fluorine-containing gas) is terminated. This disclosure contemplates other process conditions being used, if appropriate.

This disclosure contemplates plasma step 132b being executed for any suitable time period, as it is believed that any additional time during which passivation layer 124 is generated will improve the resulting profile of the structure formed by process 100. Increased time periods may result in increasingly improved etch profiles; however, longer time periods also impact total processing time for forming a device using substrate 102 as part of an integrated process. It has been found that 5 to 30 seconds significantly improves an etch profile of film stack 104, though this disclosure is not limited to this range of time periods.

Figure 1F:
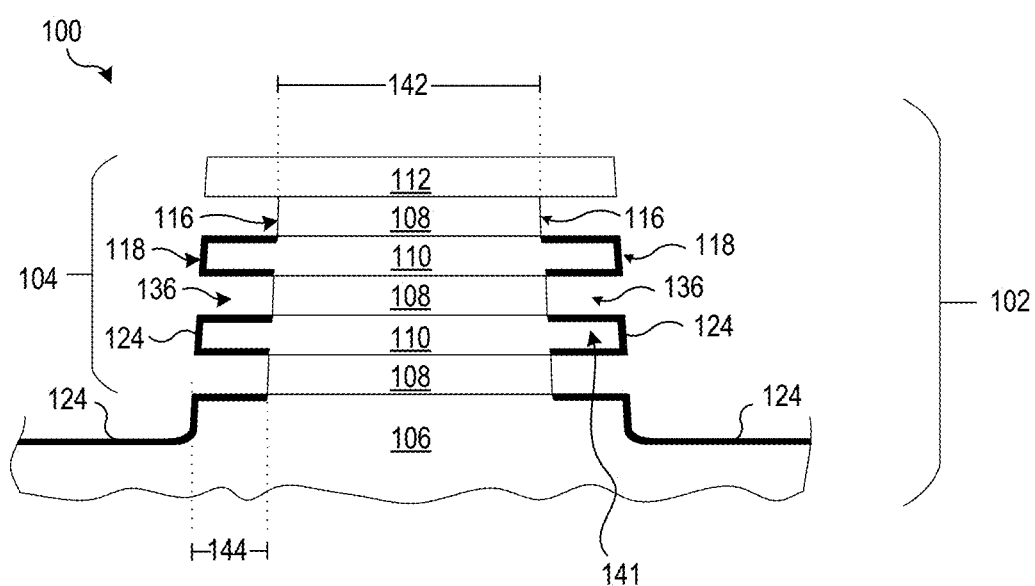

FIG. 1F illustrates substrate 102 following plasma steps 120 and 132. In the state illustrated in FIG. 1F, film stack 104 includes indents 136 (of which two examples are labeled). Furthermore, due to the formation of indents 136, exposed ends 141 (of which one example is labeled) of Ge-containing layers no may be formed.

FIG. 1F shows certain measurements of resulting substrate 102, such as exposed end separation 142 and etched width 144. For example, exposed end separation 142 shows the remaining width (per this cross-section) of Si layers 108 by measuring each Si layer 108 from a first exposed surface 116 on a first side of film stack 104 to an opposing second exposed surface 116 on a second side of film stack 104. Exposed end separation 142 may be less than 20 nm in certain embodiments, and between 2 nm and 20 nm in a particular embodiment. The exposed end separation may also refer to the separation of exposed ends prior to etching. Etched width 144 may measure how much of a particular Si layer 108 was removed from an end of the particular Si layer 108. In other words, etched width 144 may measure the amount of an indent 136 of a Si layer 108. In certain embodiments, etched width 144 is about 5 nm to about 15 nm. However, exposed end separation 142 and etched width 144 may be outside these ranges depending on a given application.

Subsequent processing may be performed on substrate 102. For example, plasma steps 120 and 132 may be integrated into a process for forming Ge-containing layers 110 into respective nanowires for a channel region of a semiconductor device (e.g., a GAA device). In such a device, subsequent processing may include filling indents 136 with an insulator, removing remaining portions of Si layers 108, providing a gate oxide around Ge-containing layers 110, and other associated steps, all of which are provided for example purposes only. In such a device, exposed ends 141 of Ge-containing layers 110 may serve as conductive contacts to a channel region formed in the area of film stack 104.

In the example of FIGS. 1A-1F, plasma steps 120 and 132 are performed in the same plasma chamber of the same plasma tool, without removing substrate 102 from the plasma tool. Plasma steps 120 and 132, however, may be performed in the same or different plasma tools, as appropriate. Furthermore, although process 100 is described as including a purge step (e.g., as shown in FIG. 1C), the purge step may be omitted, if appropriate.

Process 100 may provide one or more technical advantages. In certain embodiments, the surface modification step of process 100 (plasma step 120) modifies barrier layer 114 at exposed surfaces 116 of Si layers 108 and exposed surfaces 118 of Ge-containing layers 110, which may result in improved surface roughness and local uniformity in film stack 104 after a subsequent etch step to form indents 136 in film stack 104. For example, an edge profile of layers bordering indent 136 show improved surface roughness and local uniformity relative to conventional techniques, such as those that do not remove an NOL prior to performing an indent etch of a film stack like film stack 104 and instead simply perform a single plasma etch (e.g., using fluorine- and oxygen-containing plasma, such as $NF_3$ and $O_2$) to remove the NOL and etch indents in the film stack. Improving surface roughness and local uniformity may improve channel mobility in resulting devices formed using the substrate 102 of FIG. 1F.

In certain embodiments, despite removing or otherwise modifying barrier layer 114, in contrast to conventional techniques that simply remove a barrier layer (e.g., an NOL) from the entire film stack (using a wet or dry etch) at the expense of desired selectivity in a subsequent step for etching indents in the film stack, the surface modification step of process 100 forms passivation layer 124 on exposed surfaces 118 of Ge-containing layers 110. Passivation layer 124 inhibits etching of exposed surfaces 118 of Ge-containing layers 110 in a subsequent etch process for etching indents in film stack 104, thereby providing desired selectivity to the Ge-containing layers 110 in the subsequent etch process. Furthermore, the surface modification step and the subsequent etch process may be performed in a same plasma chamber of a plasma tool, making process 100 in situ in certain embodiments.

This disclosure contemplates performing process 100 with or without plasma step 132b. Performing plasma step 132b may provide one or more technical advantages. Terminating injection (flow) of the etchant-containing gas (e.g., $NF_3$) into plasma chamber 123 prior to terminating injection (flow) of the passivation-triggering gas (e.g., $O_2$) into plasma chamber 123 allows the passivation reactants (e.g., oxygen atoms) in the generated plasma (plasma 134') to continue to form passivation layer 124 on exposed surfaces 118 and additional surfaces 138 of Ge-containing layers 110 while the etchants (e.g., fluorine atoms) in plasma 134' expire. Depending on the time period used, this technique reduces or eliminates the opportunity for exposed surfaces 118 and additional surfaces 138 of Ge-containing layers 110 to be exposed to the etchants (e.g., fluorine atoms) in plasma 134' without a passivation layer 124 being formed on those exposed surfaces 118 and additional surfaces 138.

The continued formation of passivation layer 124 preserves the selectivity of plasma 134/134' to etch Si layers 108 rather than Ge-containing layers 110, as the etchants (e.g., fluorine atoms) in plasma 134' expire. Additionally, this preserved selectivity may reduce or eliminate "gouging" of Ge-containing layers 110 at the etch front in areas near the interface of Ge-containing layers 110 and their adjacent Si layers 108 in film stack 104, as well as excessive etching of Si layers 108. For example, the continued formation of passivation layer 124 on additional surfaces 138 of Ge-containing layers 110, particularly as those additional surfaces 138 continue to be revealed after termination of the flow of the etchant gas but prior to the expiration of the etchants in plasma 134', may reduce or eliminate etching of Ge-containing layers 110 at the etch front. Furthermore, preserving the selectivity of plasma 134' to etch Si and reducing or eliminating this gouging of the Ge-containing layers at the etch front improves the local uniformity of Ge-containing layers 110 by providing a more uniform thickness of Ge-containing layers 110.

Figure 2A:
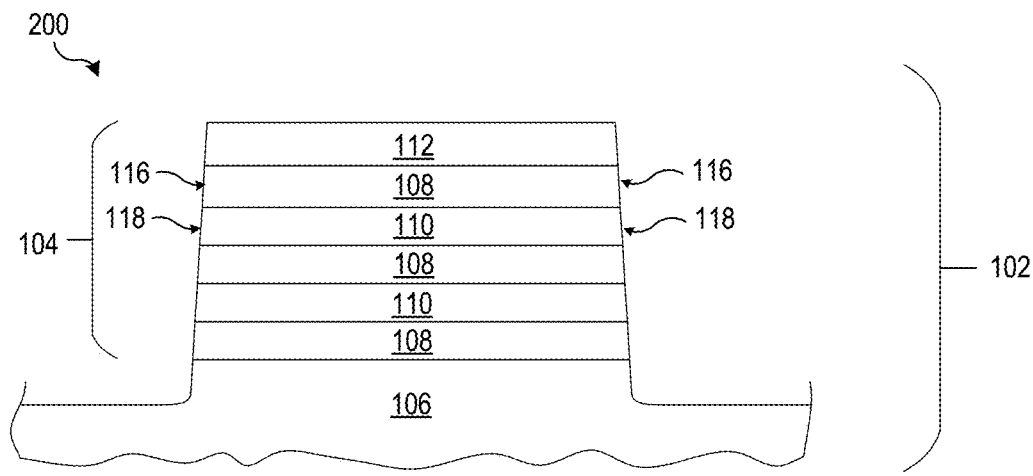
FIGS. 2A-2C illustrate cross-sectional views of an example semiconductor substrate during example process for processing the semiconductor substrate.
Figure 2B:
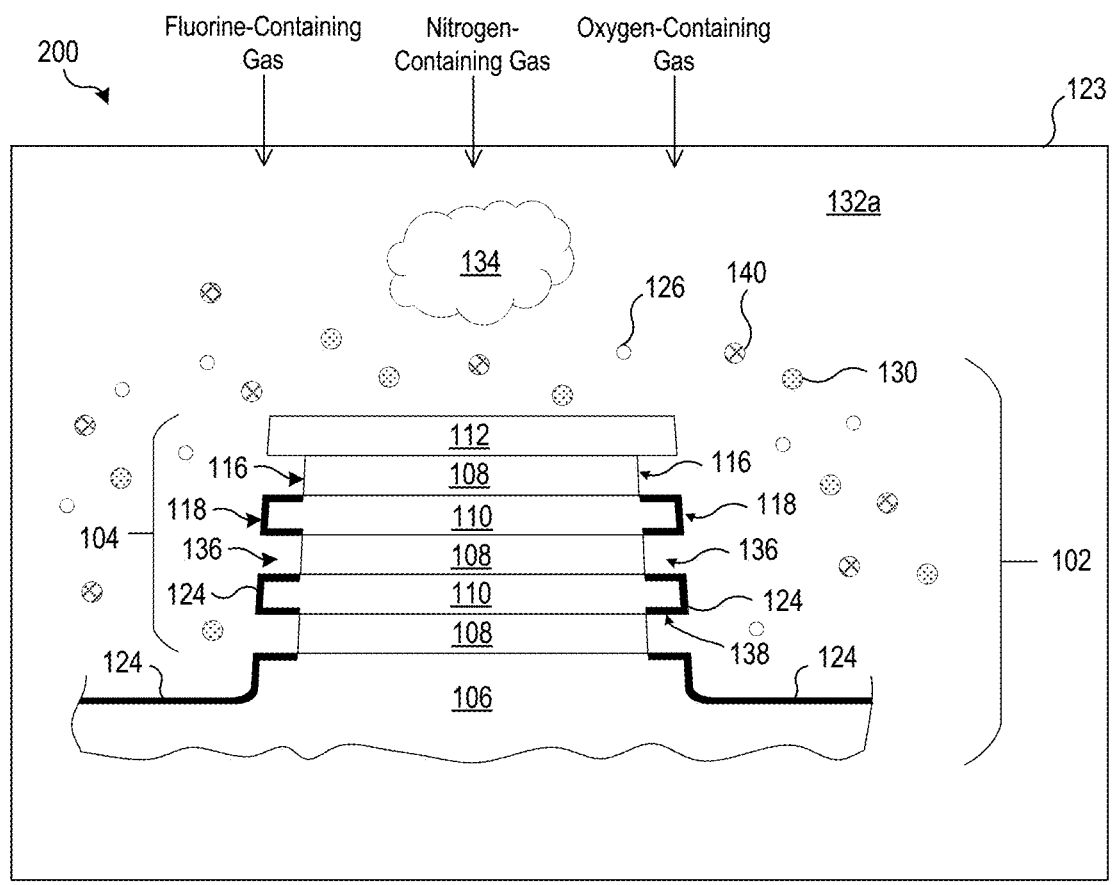
Figure 2C:
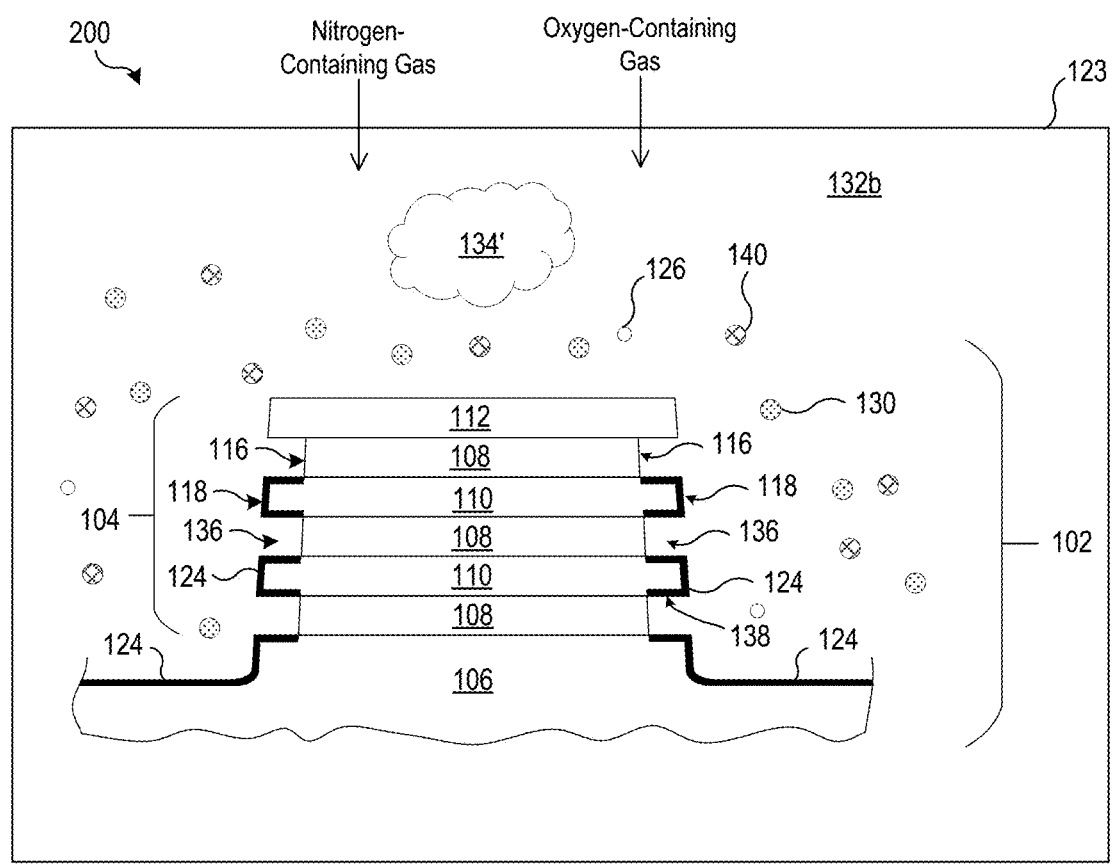

FIGS. 2A-2C illustrate cross-sectional views of an example substrate 102 during example process 200 for processing substrate 102, according to certain embodiments. Process 200 illustrates that plasma step 132b of FIG. 1E can be performed without performing plasma step 120. Process 200 may begin with a substrate 102 similar to that illustrated and described with reference to FIG. 1A, the details of which are not repeated but are incorporated by reference.

As illustrated in FIG. 2A, barrier layer 114 is etched to remove some or all of barrier layer 114 from exposed surfaces 116 of Si layers 108, from exposed surfaces 118 of Ge-containing layers 110, and from exposed surfaces of base layer 106 and hard mask 112. Barrier layer 114 may be removed using any suitable process, including any suitable wet etch or dry etch process. In certain embodiments, substrate 102 is processed using a dilute HF acid or a chemical oxide removal process to remove some or all of barrier layer 114. The process used to etch barrier layer 114 might or might not remove some or all of hard mask 112, but for purposes of this example, hard mask 112 is shown not to be removed or otherwise etched. Removing barrier layer 114 prior to performing the etch process described below with reference to FIG. 2B is optional.

FIGS. 2B-2C illustrate analogous plasma steps 132a and 132b to plasma steps 132a and 132b, respectively, of FIGS. 1B and 1D. Therefore, the details are not repeated but are incorporated by reference. Because plasma step 120 is omitted in process 200, an entirety of passivation layer 124 (both on exposed surfaces 118 and additional surfaces 138 of Ge-containing layers 110) may be an oxide passivation layer.

Process 200, following FIG. 2C, may produce a similar structure to substrate 102 illustrated in FIG. 1F. Thus, the details of FIG. 1F are not repeated by are incorporated by reference. It will be understood that performing the barrier layer removal process of FIG. 2A rather than plasma step 120 of FIG. 1B may result in some differences in the resulting substrate 102.

Figure 3:
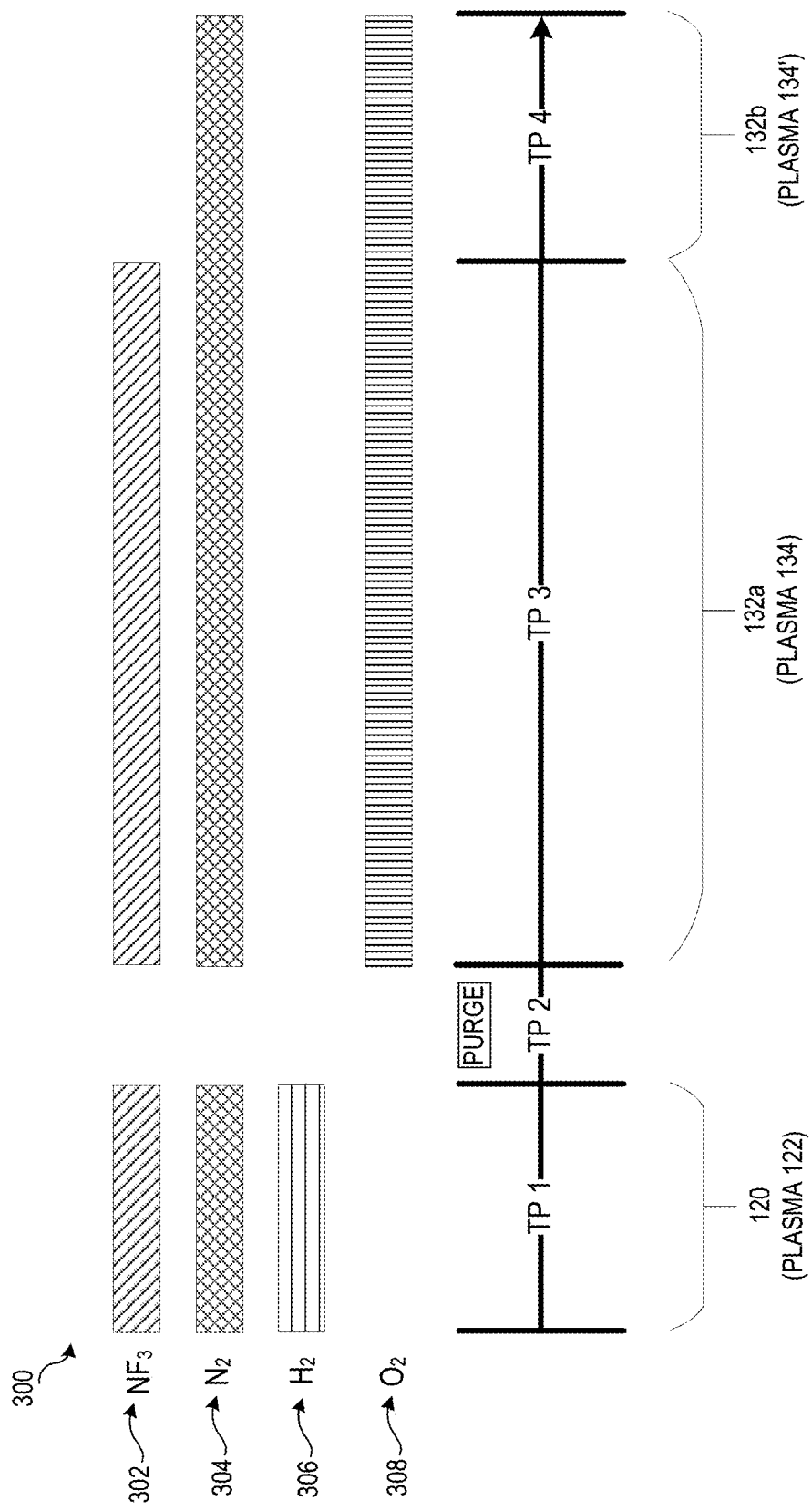
FIG. 3 illustrates an example timeline of gas injections and terminations.

FIG. 3 illustrates an example gas flow timeline 300, according to certain embodiments. In particular, gas flow timeline 300 shows the initiation and termination of gas flows for an example of process 100. A gas flow also may be referred to as a gas injection. For purposes of this example, it will be assumed that the gases used to form plasma 122 include $NF_3$, $H_2$, and $N_2$, and that the gases used to form plasma 134 include $NF_3$, $O_2$, and $N_2$. Other gases may be used, as described elsewhere in this disclosure. Although gas flows are shown as being initiated at the same instant at the beginning of a time period (abbreviated TP 1, TP 2, etc. in FIG. 3), gas flow initiation times may vary, if appropriate. Furthermore, although gas flows are shown as terminating at the end of a time period (if applicable), gas flows may be terminated prior to the end of a time period, if appropriate.

In the illustrated example, gas flow 302 corresponds to $NF_3$ gas, gas flow 304 corresponds to $N_2$, gas flow 306 corresponds to $H_2$ gas, and gas flow 308 corresponds to $O_2$ gas. Gas flows 302, 304, and 306 are active during time period TP 1, which corresponds to plasma step 120, to facilitate generation of plasma 122. Gas flows 302, 304, and 306 are terminated at the end of time period TP 1/start of time period TP 2, and plasma chamber 123 is purged during time period TP 2. Gas flows 302, 304, and 308 are active during time period TP 3, which corresponds to plasma step 132a, to facilitate generation of plasma 134. Gas flow 302 is terminated at the end of time period TP 3/start of time period TP 4, while gas flows 304 and 308 continue as active through time period TP 4 to facilitate generation of plasma 134'. Time period TP 4 corresponds to plasma step 132*b*.

Figure 4:
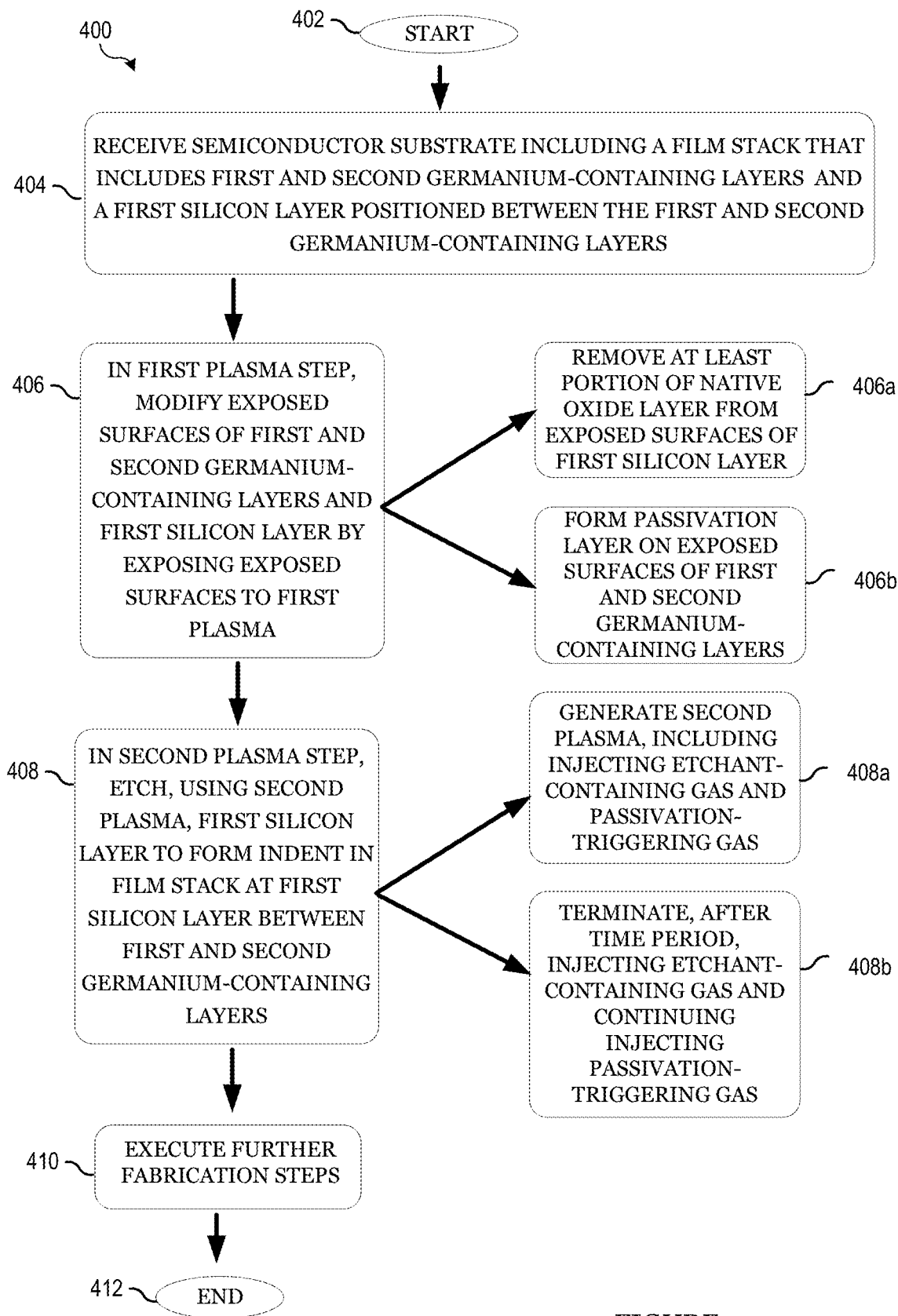
FIG. 4 illustrates an example method for processing a semiconductor substrate.

FIG. 4 illustrates an example method 400 for processing a substrate 102, according to certain embodiments. Method 400 begins at step 402. At step 404, substrate 102 is received. Substrate 102 may include film stack 104, which may include alternating Si layers 108 and Ge-containing layers 110 (e.g., as illustrated in FIG. 1A).

At step 406, in a first plasma step (e.g., plasma step 120), exposed surfaces of substrate 102 (e.g., including exposed surfaces 116 of Si layers 108 and exposed surfaces 118 of Ge-containing layers 110) are modified by exposing the exposed surfaces to plasma 122. In certain embodiments, plasma 122 includes fluorine, nitrogen, and hydrogen. Modifying the exposed surfaces may include, at step 406*a*, removing or chemically modifying at least a portion of a barrier layer 114 from exposed surfaces 116 of Si layers 108 and forming, at step 406*b*, passivation layer 124 on exposed surfaces 118. Forming passivation layer 124 may include removing barrier layer 114 from exposed surfaces 118 of Ge-containing layers 110 and modifying resulting exposed surfaces 118 of Ge-containing layers 110 to include passivation layer 124. In certain embodiments, plasma chamber 123 is purged between steps 406 and 408.

At step 408, in a second plasma step (e.g., plasma step 132), Si layers 108 are etched using plasma 134 to form indents 136 in film stack 104 at Si layers 108 relative to adjacent Ge-containing layers 110. Passivation layer 124 inhibits etching of Ge-containing layers 110. In certain embodiments, plasma 134 includes fluorine and oxygen. As a particular example, the second plasma may be generated from gases including $NF_3$, $O_2$, and, in certain embodiments, $N_2$. In certain embodiments, step 408 is an isotropic etch process.

In certain embodiments, step 408 includes steps 408*a* and 408*b*. At step 408*a*, plasma 134 is generated. Generating plasma 134 includes injecting an etchant-containing gas (e.g., a fluorine-containing gas, such as $NF_3$), a passivation-triggering gas (e.g., $O_2$), and, in certain embodiments, a carrier gas (e.g., $N_2$) into plasma chamber 123, and plasma 134 includes etchant agents (e.g., fluorine agents 126) and passivation agents (e.g., oxygen agents 140). At step 408*b*, after a time period, injecting of the etchant-containing gas (e.g., a fluorine-containing gas, such as $NF_3$) is terminated and injecting of the passivation-triggering gas (e.g., $O_2$), and in certain embodiments the carrier gas (e.g., $N_2$), is continued for an additional time period.

At step 410, additional fabrication steps are executed. The discussion of potential additional processing steps described above with reference to FIG. 1F is incorporated by reference. For example, in certain embodiments, steps 406 and 408 are integrated into a process for forming Ge-containing layers 110 into respective nanowires for a channel region of a semiconductor device, such as a GAA device. At step 412, method 400 ends.

Figure 5:
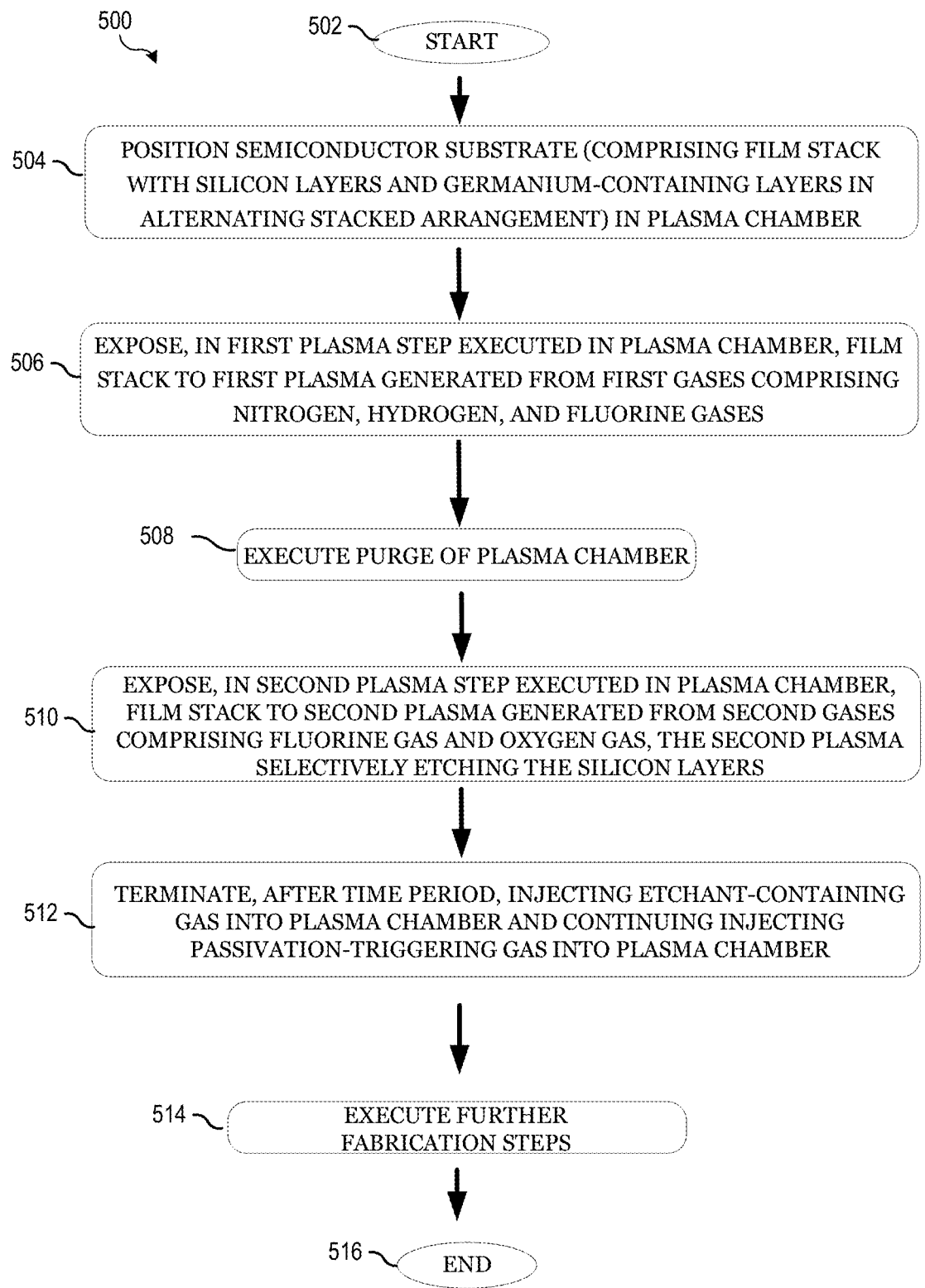
FIG. 5 illustrates an example method for processing a semiconductor substrate.

FIG. 5 illustrates an example method 500 for processing a substrate 102, according to certain embodiments. Method 500 begins at step 502. At step 504, substrate 102 is positioned in plasma chamber 123. Substrate 102 may include film stack 104 that includes Si layers 108 and Ge-containing layers 110 in an alternating stacked arrangement (e.g., as shown in FIG. 1A).

At step 506, in a first plasma step (e.g., plasma step 120) executed in plasma chamber 123, substrate 102 (including film stack 104) is exposed to plasma 122. Plasma 122 may be generated from gases that include fluorine gas, hydrogen gas, and nitrogen gas. In certain embodiments, the gases include $NF_3$, $N_2$, and $H_2$.

At step 508, a purge of plasma chamber 123 is executed.

At step 510, in a second plasma step (e.g., plasma step 132*a*) executed in plasma chamber 123, semiconductor substrate 102 (including film stack 104) is exposed to plasma 134. Plasma 134 may be generated from gases that include fluorine gas (e.g., $NF_3$), oxygen gas (e.g., $O_2$), and, in certain embodiments, a carrier gas (e.g. $N_2$). Plasma 134 selectively etches Si layers 108. Step 510 may be an isotropic etch process. In certain embodiments, step 510 includes generating plasma 134. Generating plasma 134 includes injecting an etchant-containing gas (e.g., a fluorine-containing gas, such as $NF_3$), a passivation-triggering gas (e.g., $O_2$), and, in certain embodiments, a carrier gas (e.g. $N_2$) into plasma chamber 123, and plasma 134 includes etchant agents (e.g., fluorine agents 126) and passivation agents (e.g., oxygen agents 140). At step 512, in the second plasma step (e.g., plasma step 132*b*) executed in plasma chamber 123, after a time period, injecting of an etchant-containing gas into plasma chamber 123 is terminated and injecting of a passivation-triggering gas and, in certain embodiments, a carrier gas into plasma chamber 123 is continued.

In certain embodiments, steps 506, 510, and 512 are executed in plasma chamber 123 without removing substrate 102 from plasma chamber 123 (e.g., in situ).

At step 514, additional fabrication steps are executed. The discussion of potential additional processing steps described above with reference to step 410 of FIG. 4 is incorporated by reference. At step 516, method 500 ends.

Figure 6:
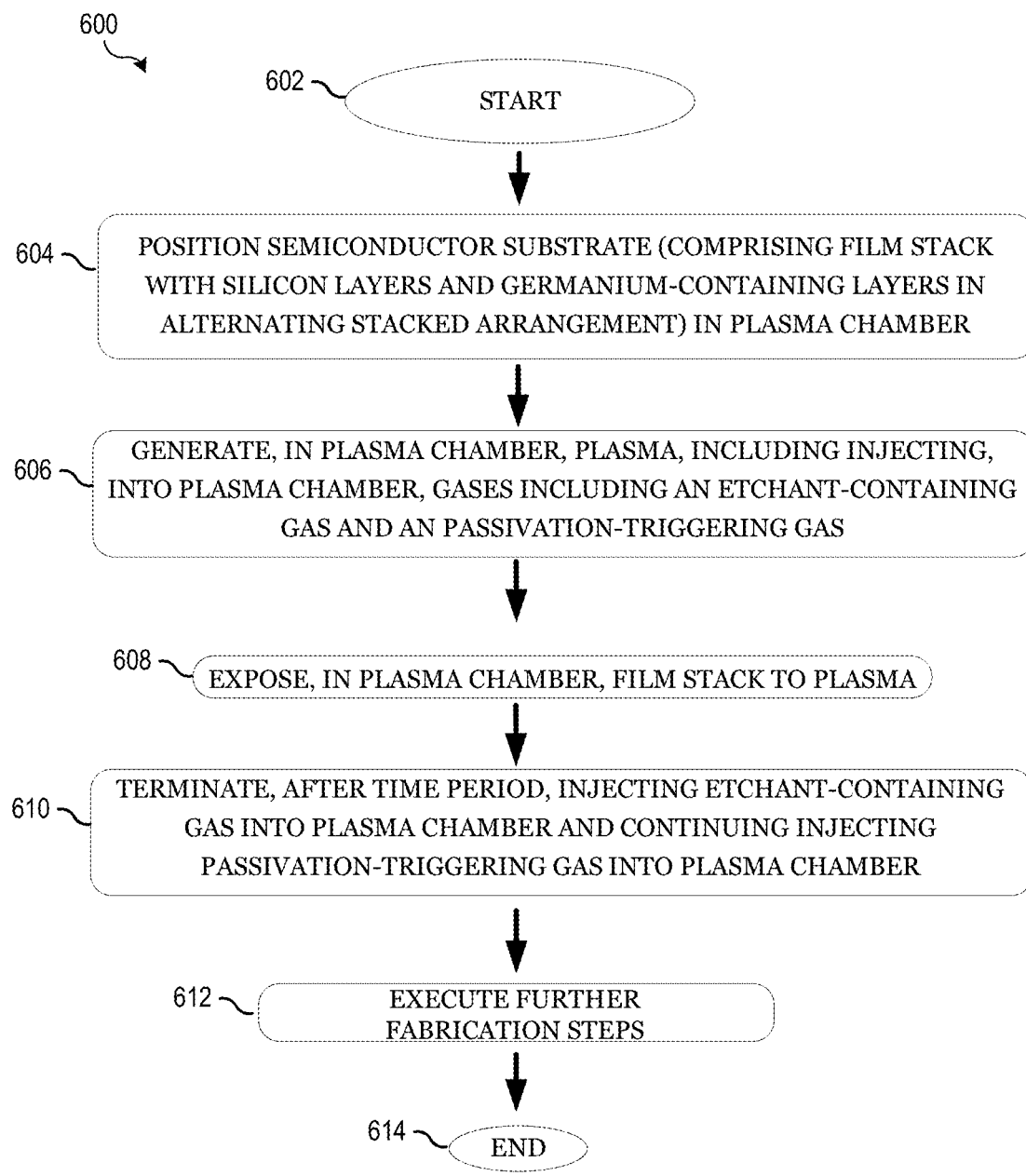
FIG. 6 illustrates an example method for processing a semiconductor substrate.

FIG. 6 illustrates an example method 600 for processing a substrate 102, according to certain embodiments. Method 600 begins at step 602. At step 604, substrate 102 is positioned in plasma chamber 123. Substrate 102 may include film stack 104 that includes Si layers 108 and Ge-containing layers 110 in an alternating stacked arrangement (e.g., as shown in FIG. 1A). In certain embodiments, substrate 102 includes a barrier layer 114 over film stack 104 (including, potentially, hard mask 112) and, in this example, base layer 106, and method 600 may include etching barrier layer 114 (e.g., to remove barrier layer 114). Barrier layer 114 may be removed using any suitable process, including any suitable wet etch or dry etch process, as described above. In certain embodiments, substrate 102 of step 604 could be substrate following plasma step 132*a* of FIG. 1D.

At step 606, plasma 134 is generated in plasma chamber 123. Generating plasma 134 includes injecting, into plasma chamber 123, gases including an etchant-containing gas (e.g., a fluorine-containing gas, such as $NF_3$), a passivation-triggering gas (e.g., $O_2$), and, in certain embodiments, a carrier gas (e.g. $N_2$). Plasma 134 may include etchant agents (e.g., fluorine agents 126) and passivation agents (e.g., oxygen agents 140). At step 608, substrate 102, including film stack 104, is exposed to plasma 134 in plasma chamber 123.

At step 610, after a time period, injection of the etchant-containing gas into plasma chamber 123 is terminated while injection of the oxygen-containing gas and, in certain embodiments, the carrier gas into plasma chamber 123 continues, generating plasma 134'. Terminating injection of the etchant-containing gas while continuing injection of the passivation-triggering gas and, in certain embodiments, the carrier gas continues to form passivation layer 124 on exposed surfaces 118 and additional surfaces 138 of Ge-containing layers 110, thereby protecting Ge-containing layers 110 from etching as etching agents (e.g., fluorine agents 126) expire in plasma chamber 123. In certain embodiments, after terminating injecting the etchant-containing gas into plasma chamber 123, injecting the oxygen-containing gas and, in certain embodiments, the carrier gas into plasma chamber 123 continues for greater than about one second and possibly greater than about five seconds.

At step 612, additional fabrication steps are executed. The discussion of potential additional processing steps described above with reference to step 410 of FIG. 4 is incorporated by reference. At step 614, method 600 ends.

Figure 7:
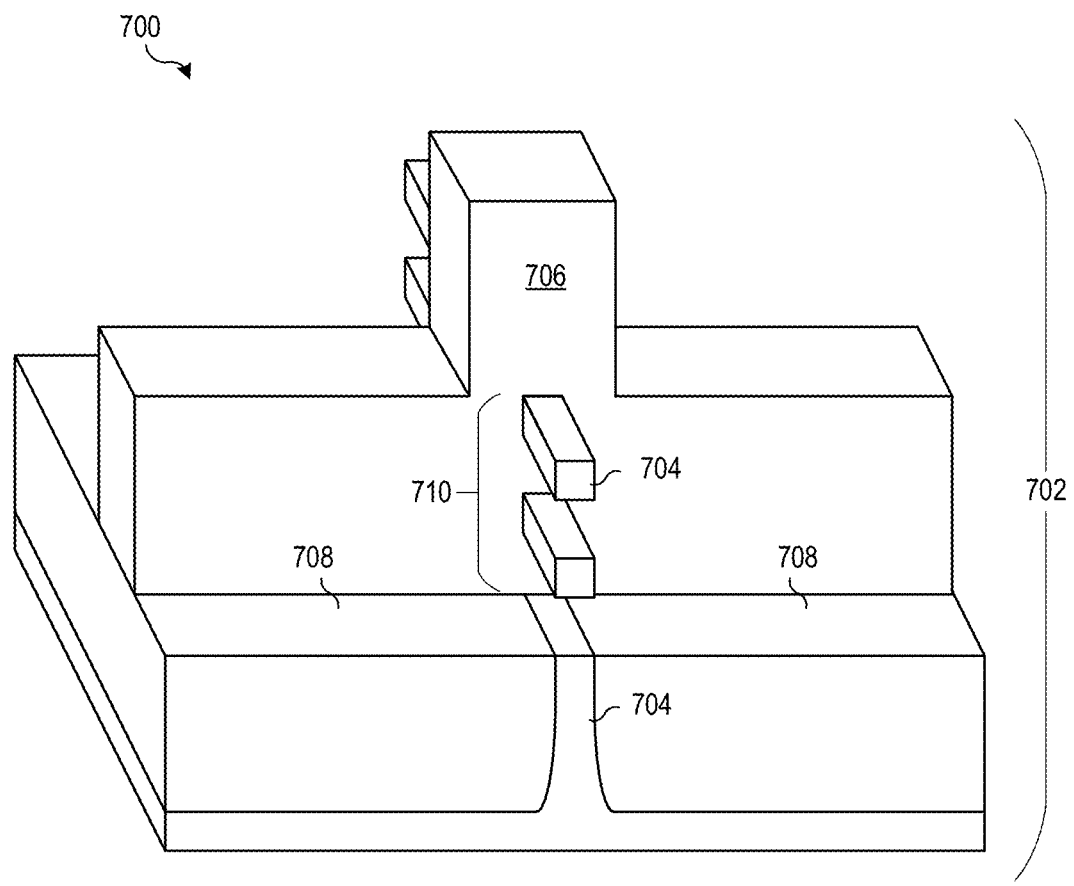
FIG. 7 illustrates an example device including a substrate with a recessed alternating film stack.

FIG. 7 illustrates an example device 700 including a substrate with a recessed alternating film stack according to certain embodiments. At least a portion of device 700 may be formed using any of the processes and methods as described herein.

Device 700 includes a substrate 702 that includes a channel material 704 (e.g., Ge or SiGe) and a gate material 706, (e.g. SiGe or Si). Channel material 704 may correspond to Ge-containing layers 110 of substrate 102, at some point after process 100 or process 200. Device 700 may be a GAA device as shown here or may be any other device, such as a fin field-effect transistor (FinFET). Device 700 also may include isolation regions 708. In certain embodiments, isolation regions 708 are shallow trench isolations (STIs).

Device 700 may be fabricated by first forming a recessed alternating film stack 710 (which may correspond to film stack 104 following process 100 or process 200, possibly with additional subsequent processes) and then depositing additional gate material 706 over recessed alternating film stack 710. Specifically, device 700 may be formed by heteroepitaxial growth of alternating Si and Ge or SiGe layers which are then patterned and recessed vertically to expose the Ge or SiGe layers laterally.

The application of embodiments described herein may advantageously be an optimal solution for the 5 nm node, 3 nm node, or lower. For example, the GAA device architecture may be suitable for scaling beyond the 7 nm node. The GAA device architecture may address short channel effects found in some FinFET architectures by wrapping the gate around the entire channel instead of only three sides. This could reduce or eliminate current leakage occurring under the gate of the FinFET, therefore reducing non-active power losses.

Figure 8:
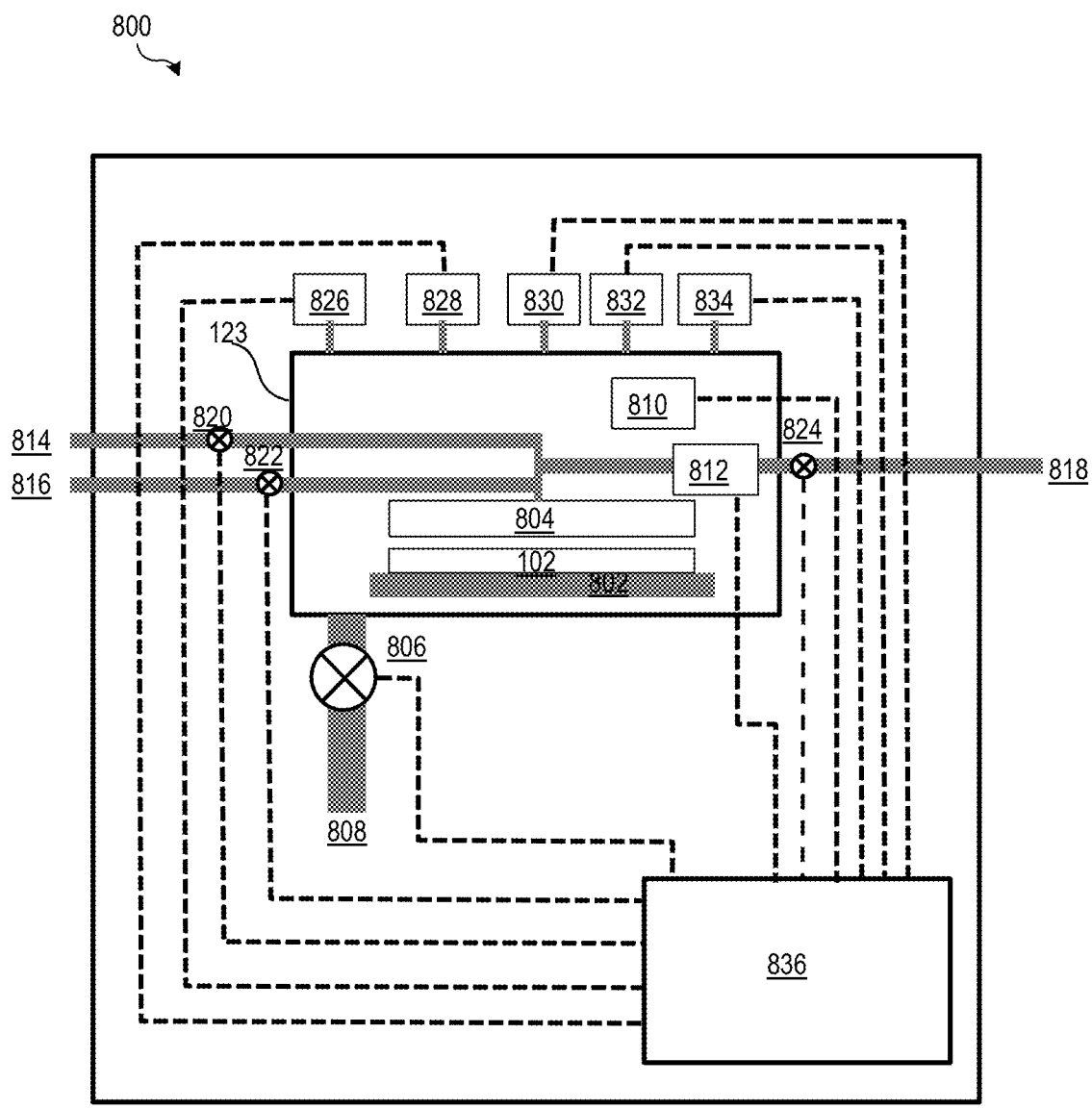
FIG. 8 illustrates a block diagram of an example plasma tool.

FIG. 8 illustrates a block diagram of an example plasma tool 800, according to certain embodiments. Although a particular plasma tool 800 is illustrated and described, any suitable type of plasma tool may be used. Plasma tool 800 may be used to execute plasma steps 120, 132a, and/or 132b, for example.

Plasma tool 800 includes plasma chamber 123 in which a semiconductor substrate (e.g., substrate 102) is processed using a plasma (e.g., plasma 122, 134, and/or 134'). Plasma chamber 123 includes a substrate table 802 configured to support substrate 102 during processing. For example, substrate 102 may be positioned on substrate table 802 in the condition shown in FIG. 1A or 2A. Exposed surfaces 116 of Si layers 108 and exposed surfaces 118/additional surfaces 138 of Ge-containing layers are modified within plasma chamber 123 by injecting a plasma (e.g., plasma 122) through a shower head 804. Si layers 108 are selectively etched within plasma chamber 123 by injecting plasma (e.g., plasma 134/134') through shower head 804. Shower head 804 may include a single mixed reaction cavity that is filled with precursor gases, mixing gases, and carrier gases that mix to form plasma 122/134/134' and a set of exit holes for dispensing plasma 122/134/134' toward substrate 102.

Plasma chamber 123 includes and/or is otherwise coupled to a vacuum pump 806 coupled to a vacuum line 808 to purge residual gases from plasma chamber 123 and also may include and/or otherwise be coupled to a pressure system to maintain a target pressure in certain embodiments. Plasma chamber 123 may further include machine tools such as a heater 810 and temperature sensor 812 used to heat substrate 102 and control the temperature within plasma chamber 123 and/or of substrate 102.

Shower head 804 may be coupled to a precursor gas line 814, a mixture gas line 816, and a carrier gas line 818, through which gases injected into plasma chamber 123 to generate plasmas 122, 134, and 134' are fed. Plasma tool 800 may include a system of flow controllers and sensors for controlling gas flow (e.g., mass flow rate). For example, plasma tool 800 may include a first flow controller 820, a second flow controller 822, a third flow controller 824, vacuum pump 806, heater 810, temperature sensor 812, voltage-current (V-I) sensor 826, and substrate sensors 828, 830, 832, and 834 (828-834). Precursor gas line 814, mixture gas line 816, and carrier gas line 818 are coupled to and controlled by first, second, and third flow controllers 820, 822, and 824, respectively.

Plasma tool 800 may include a controller 836 to control various aspects of plasma steps 120, 132a, and/or 132b. Controller 836 may be implemented in any suitable manner. For example, controller 836 may be or include a computer or one or more programmable ICs programmed to provide functionality described herein. In a particular example, one or more processors (e.g., microprocessor, microcontroller, central processing unit, etc.), programmable logic devices (e.g., complex programmable logic device), field programmable gate array, etc.), and/or other programmable ICs are programmed with software or other programming instructions to implement functionality described herein for controller 836. The software or other programming instructions can be stored in one or more non-transitory computer-readable mediums, and, when executed by the programmable ICs, cause the programmable ICs to perform operations described herein.

Machine components such as heater 810 and temperature sensor 812 of plasma chamber 123, as well as flow controllers 820, 822, and 824, vacuum pump 806, and other components external to plasma chamber 123, are coupled to and controlled by controller 836.

Equipment sensors measure equipment parameters, such as substrate table 802 temperature, heater 810 currents, and vacuum pump 806 speed and temperature, and provide signals to ensure the equipment is operating properly. Process sensors measure process parameters, such as process temperature, process pressure, plasma density, gas flow rates, and gas composition, and provide signals to ensure the process is operating properly. The data from the equipment and process sensors provide feedback to controller 836 continuously throughout plasma steps 120, 132a, and/or 132b. Controller 836 can make adjustments in real time to keep the equipment and process close to center of specifications.

Controller 836 receives data from the sensor(s) and controls one or more process parameters of plasma chamber 123 based on the sensor data. Controller 836 may analyze the data collected by the sensor(s), determine when to modify or end one or more steps of plasma steps 120, 132a, and/or 132b, and provide feedback to control process parameters of components of plasma chamber 123.

Controller 836 may be connected to V-I sensor 826, and substrate sensors 828-834 to monitor plasmas 122/134/134' as substrate 102 is exposed to these plasmas to provide plasma conditions as well as optionally composition and thickness data in real time. Controller 836 may use this feedback data to continuously adjust plasma steps 120, 132a, and/or 132b as substrate 102 is selectively etched using plasmas 122/134/134' and, for example, to turn off plasma steps 120, 132a, and/or 132b when the target indent (e.g., etched width 144) is reached. Specifically, controller 836 may receive measurement data from substrate sensors 828-834, and temperature sensor 812 and controller 836 may send control signals to first, second, and third flow controllers 820, 822, and 824, and to vacuum pump 806 and heater 810.

Controller 836 may receive measurement or metrology data from substrate sensors 828-834 taken at multiple points across substrate 102 to measure process uniformity and the thickness and composition of passivation layer 124 (formed from exposure of substrate 102 to plasmas 122/134/134'), exposed end separation 142, and/or the target indent (e.g., etched width 144) in situ and in real time. For example, multiple across-substrate sensors in a multi-substrate plasma tool can be used to monitor and tune these properties of substrate 102, both from the top to the bottom of substrate 102 and from center to the edge of substrate 102.

Substrate sensors 828-834 may be coupled to and/or located within plasma chamber 123 for monitoring parameters of substrate 102, plasma tool 800 and/or plasma steps 120, 132a, and/or 132b. Substrate sensors 828-834 may include optical sensors (e.g., cameras, lasers, light, reflectometer, spectrometers, ellipsometric, etc.), capacitive sensors, ultrasonic sensors, gas sensors, or other sensors. For example, one or more optical sensors may measure in real time (during plasma steps 120, 132a, and/or 132b) the thickness and refractive index of the material at exposed surfaces 118/additional surfaces 138 of Ge-containing layers 110 and surfaces of base layer 106 (e.g., where passivation layer 124 is being formed), exposed end separation 142, and/or an etched width 144 (or another suitable measurement). As another example, a spectrometer may measure in real time (during plasma steps 120, 132a, and/or 132b) a film thickness of the material at these locations of semiconductor device 102. In yet another embodiment, a residual gas analyzer (RGA) may detect in real time (during plasma steps 120, 132a, and/or 132b) precursor breakdown for real-time chemical reaction completion detection.

Controller 836 may receive user-input process parameters, including, for example, etch rate, conformality, profile (of film stack 104), and deposition rate (e.g., of passivation layer 124) based on plasma parameters such as pressure, temperature, RF source power, RF bias power, RF waveform (e.g., continuous wave RF, pulsed RF, square pulse, sawtooth pulse, etc.), etch time, and composition and flow rates of gases, advantageously allowing a user to tune plasmas to meet a target local critical dimension uniformity.

Based on data from substrate sensors 828-834 and user-specified process parameters, controller 836 generates control signals to temperature sensor 812 and heater 810 to adjust the heat within plasma chamber 123 and/or on substrate 102. As heater 810 heats plasma chamber 123, controller 836 constantly or periodically monitors temperature sensor 812 to track the temperature of plasma chamber 123 and/or substrate 102 to send control signals to heater 810 to maintain the temperature in plasma chamber 123 and/or on substrate 102. Once controller 836 determines, based on data from temperature sensor 812, that the target temperature of plasma chamber 123 and/or on substrate 102 has been reached, controller 836 generates signals to activate first, second, and third flow controllers 820, 822, and 824 and provide, based on user-input process parameters, target flow rates to first, second, and third flow controllers 820, 822, and 824. Once controller 836 determines that the corresponding flow rates are established, controller 836 provides power to plasma chamber 123 to power plasma 122/134/134' through bias and source electrodes, which may be adjusted based on measurements from V-I sensor 826. First, second, and third flow controllers 820, 822, and 824 each may be a closed loop control system connected to a flow rate sensor and an adjustable proportional valve that allows each flow controller to monitor and internally maintain the target flow rates of each gas via the flow rate sensor and the adjustable proportional valve. Once controller 836 determines, based on user input, that the etch process time has been met, controller 836 generates control signals to deactivate first, second, and third flow controllers 820, 822, and 824, which may be deactivated at the same or different times, as appropriate.

Controller 836 may analyze substrate sensor data to determine when to end plasma steps 120, 132a, and/or 132b. For example, controller 836 may receive data from an RGA to detect an endpoint of plasma steps 120, 132a, and/or 132b. In another example, controller 836 may use spectroscopic ellipsometry to detect an average film thickness of passivation layer 124, exposed ends 141 of Ge-containing layers 110, and/or exposed end separation 142 during plasma steps 120, 132a, and/or 132b and indicate changes during the plasma steps. In another example, controller 836 may use spectroscopic ellipsometry to detect the refractive index of the material at exposed surfaces 118/additional surfaces 138 of Ge-containing layers 110 and surfaces of base layer 106 (e.g., where passivation layer 124 is being formed) during plasma steps 120, 132a, and/or 132b and indicate film composition change during the plasma steps. Controller 836 may automatically end plasma steps 120, 132a, and/or 132b when an exposed end separation 142 and/or an etched width 144 (or another suitable measurement) objective is achieved. Controller 836 may automatically adjust one or more parameters such as the gas ratios, for example, during plasma steps 120, 132a, and/or 132b to achieve the desired etch profile of film stack 104. Controller 836 and the data from substrate sensors 828-834 also may be used to achieve a desired semiconductor substrate throughput.

Although described for a particular application of forming nanowires/nanosheets for GAA devices, this disclosure may be used in any type of isotropic etch of Si that is selective to Ge-containing layers. Furthermore, although the etch being performed is primarily described as being for forming indents in film stack 104 by removing portions of opposing ends of Si layers 108, processes 100 and 400 may be used to remove substantially all portions of Si layers 108, which may be referred to as releasing Ge-containing layers 110.

Although this disclosure describes particular process/method steps as occurring in a particular order, this disclosure contemplates the process steps occurring in any suitable order. While this disclosure has been described with reference to illustrative embodiments, this description is not intended to be construed in a limiting sense. Various modifications and combinations of the illustrative embodiments, as well as other embodiments of the disclosure, will be apparent to persons skilled in the art upon reference to the description. It is therefore intended that the appended claims encompass any such modifications or embodiments.

What is claimed is:

1. A method of processing a semiconductor substrate, the method comprising:

receiving a semiconductor substrate that comprises a film stack, the film stack comprising a first germanium-containing layer, a second germanium-containing layer, and a first silicon layer positioned between the first germanium-containing layer and the second germanium-containing layer;

in a first plasma step, modifying exposed surfaces of the first germanium-containing layer, the second germanium-containing layer, and the first silicon layer by exposing the exposed surfaces to a first plasma, wherein the first plasma comprises fluorine, nitrogen, and hydrogen, modifying the exposed surfaces including:

removing at least a portion of a native oxide layer from the exposed surfaces of the first silicon layer; and forming a passivation layer on the exposed surfaces of the first germanium-containing layer and the second germanium-containing layer; and in a second plasma step, etching, using a second plasma, the first silicon layer to form an indent in the film stack at the first silicon layer between the first germanium-containing layer and the second germanium-containing layer, the passivation layer inhibiting etching of the first germanium-containing layer and the second germanium-containing layer.

2. The method of claim 1, wherein the first germanium-containing layer and the second germanium-containing layer are both germanium layers or are both silicon-germanium layers.

3. The method of claim 1, wherein forming the passivation layer comprises:

removing at least a portion of a native oxide layer from the exposed surfaces of the first germanium-containing layer and the second germanium-containing layer; and modifying resulting exposed surfaces of the first germanium-containing layer and the second germanium-containing layer.

4. The method of claim 1, wherein the second plasma comprises fluorine and oxygen.

5. The method of claim 1, wherein the second plasma is generated from gases comprising $NF_3$, $O_2$, and $N_2$.

6. The method of claim 1, wherein the second plasma step further comprises:

generating the second plasma, generating the second plasma comprising injecting fluorine-containing gas, oxygen-containing gas and a carrier gas into a plasma chamber of a plasma tool; and terminating, after a time period, injecting the fluorine-containing gas into the plasma chamber and continuing injecting the oxygen-containing gas and the carrier gas into the plasma chamber.

7. The method of claim 1, further comprising purging a plasma chamber of a plasma tool between the first plasma step and the second plasma step.

8. The method of claim 1, wherein:

the film stack further comprises a third germanium-containing layer and a second silicon layer positioned between the second germanium-containing layer and the third germanium-containing layer; and the method comprises:

in the first plasma step, modifying exposed surfaces of the third germanium-containing layer and the second silicon layer by exposing the exposed surfaces of the third germanium-containing layer and the second silicon layer to the first plasma, modifying the exposed surfaces of the third germanium-containing layer and the second silicon layer including:

removing at least a portion of a native oxide layer from the exposed surfaces of the second silicon layer; and forming the passivation layer on the exposed surfaces of the third germanium-containing layer; and in the second plasma step, etching, using the second plasma, the second silicon layer to form an indent in the film stack at the second silicon layer between the second germanium-containing layer and the third germanium-containing layer, the passivation layer inhibiting etching of the third germanium-containing layer.

9. The method of claim 1, wherein the first plasma step and the second plasma step are integrated into a process for forming the first germanium-containing layer and the second germanium-containing layer into respective nanowires for a channel region of a semiconductor device.

10. The method of claim 1, wherein the first plasma step is performed at a pressure in a range of 100 mTorr to 500 mTorr and a source power in a range of 50 W to 500 W.

11. A method of processing a semiconductor substrate, the method comprising:

positioning a semiconductor substrate in a plasma chamber of a plasma tool, the semiconductor substrate comprising a film stack that comprises silicon layers and germanium-containing layers in an alternating stacked arrangement, with at least two silicon layers and at least two germanium-containing layers;

exposing, in a first plasma step executed in the plasma chamber, the film stack to a first plasma, the first plasma generated from first gases comprising nitrogen gas, hydrogen gas, and fluorine gas; and exposing, in a second plasma step executed in the plasma chamber, the film stack to a second plasma, the second plasma generated from second gases comprising fluorine gas and oxygen gas, the second plasma selectively etching the silicon layers.

12. The method of claim 11, wherein the first plasma step and the second plasma step are executed in the plasma chamber without removing the semiconductor substrate from the plasma chamber.

13. The method of claim 12, further comprising executing, prior to executing the second plasma step, a purge of the plasma chamber between the first plasma step and the second plasma step.

14. The method of claim 11, wherein the first gases comprise nitrogen trifluoride ($NF_3$).

15. The method of claim 11, wherein the second gases comprise $NF_3$, $O_2$, and a carrier gas.

16. The method of claim 11, wherein the second plasma step further comprises:

generating the second plasma, generating the second plasma comprising injecting the fluorine gas, the oxygen gas, and a carrier gas into the plasma chamber, the second plasma comprising etchant agents and passivation agents; and terminating, after a time period, injecting the fluorine gas into the plasma chamber and continuing injecting the oxygen gas and the carrier gas into the plasma chamber.

17. A method of processing a semiconductor substrate, the method comprising:

positioning a semiconductor substrate in a plasma chamber of a plasma tool, the semiconductor substrate comprising a film stack that comprises silicon layers and germanium-containing layers in an alternating stacked arrangement, with at least two silicon layers and at least two germanium-containing layers;

generating, in the plasma chamber, a plasma, generating the plasma comprising injecting, into the plasma chamber, gases comprising an etchant-containing gas, a passivation-triggering gas, and a carrier gas, the plasma comprising etchant agents and passivation agents;

exposing, in the plasma chamber, the film stack to the plasma; and terminating, after a time period, injecting the etchant-containing gas into the plasma chamber and continuing injecting the passivation-triggering gas into the plasma chamber.

18. The method of claim 17, wherein the etchant-containing gas comprises $NF_3$, the passivation-triggering gas comprises $O_2$, and the carrier gas comprises $N_2$.

19. The method of claim 17, wherein, prior to exposing the film stack to the plasma:

a native oxide layer is present on a surface of the film stack; and the method further comprises etching or chemically modifying the native oxide layer.

20. The method of claim 17, wherein, after terminating injecting the etchant-containing gas into the plasma chamber, injecting the passivation-triggering gas and the carrier gas into the plasma chamber continues for greater than about one second.

* * * * *